United States Patent
Lee et al.

(10) Patent No.: US 11,763,901 B2
(45) Date of Patent: Sep. 19, 2023

(54) NONVOLATILE MEMORY DEVICE AND METHOD OF DETECTING DEFECTIVE MEMORY CELL BLOCK OF NONVOLATILE MEMORY DEVICE

(71) Applicant: SAMSUNG ELECTRONICS CO., LTD., Suwon-si (KR)

(72) Inventors: Myungnam Lee, Hwaseong-si (KR); Daehan Kim, Seoul (KR); Wontaeck Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 75 days.

(21) Appl. No.: 17/397,012

(22) Filed: Aug. 9, 2021

(65) Prior Publication Data

US 2022/0051738 A1 Feb. 17, 2022

(30) Foreign Application Priority Data

Aug. 12, 2020 (KR) .................... 10-2020-0101411

(51) Int. Cl.
*G11C 16/34* (2006.01)
*G11C 16/28* (2006.01)
*G11C 16/16* (2006.01)

(52) U.S. Cl.
CPC .......... *G11C 16/3445* (2013.01); *G11C 16/16* (2013.01); *G11C 16/28* (2013.01); *G11C 16/3409* (2013.01)

(58) Field of Classification Search
CPC ..... G11C 16/3445; G11C 16/16; G11C 16/28; G11C 16/3409

USPC .................... 365/185.22, 200, 201
See application file for complete search history.

(56) References Cited

U.S. PATENT DOCUMENTS

| 9,053,978 | B2 | 6/2015 | Nam |
| 9,318,224 | B2 | 4/2016 | Kwak |
| 10,026,482 | B2 | 7/2018 | Yamauchi |
| 2017/0031816 | A1* | 2/2017 | Lee .................... G06F 3/061 |
| 2019/0115081 | A1* | 4/2019 | Lee .................... G11C 16/24 |
| 2022/0044758 | A1* | 2/2022 | Son .................... H01L 27/11556 |

FOREIGN PATENT DOCUMENTS

| JP | 5105351 B2 | 10/2012 |
| JP | 2013-125575 A | 6/2013 |
| KR | 10-2011-0001071 A | 1/2011 |
| KR | 10-2014-0134096 A | 11/2014 |

* cited by examiner

*Primary Examiner* — Connie C Yoha
(74) *Attorney, Agent, or Firm* — Sughrue Mion, PLLC

(57) ABSTRACT

A method of detecting, by a nonvolatile memory system, a defective memory cell block from among memory cell blocks, includes performing, after performing an erase operation, a read operation on at least some memory cells included in a target memory cell block based on an off-cell detection voltage that is different from a read reference voltage that distinguishes an off-cell on which no data is written from an on-cell on which data is written; counting a number of hard off-cells having a higher threshold voltage than the off-cell detection voltage from among the memory cells based on a result of performing the read operation; and identifying whether the target memory cell block is a defective memory cell block based on the number of counted hard off-cells.

20 Claims, 21 Drawing Sheets

FIG. 12A

|  | BL1 | BL2 |
|---|---|---|
| WL3(WL$_{DET}$) | V$_{DET}$ | V$_{DET}$ |
| WL4 | V$_{OPEN}$ | V$_{OPEN}$ |
| Channel | V$_{SUB}$ | V$_{OPEN}$ |
| WL3−Channel | V$_{DET}$ −V$_{SUB}$ | V$_{DET}$ −V$_{OPEN}$ |

FIG. 15

| BLOCK | SSL | #OFF-CELL |
|---|---|---|
| | 1 | 0 |
| | 2 | 2 |
| 1 | 3 | 1 |
| | ⋮ | ⋮ |
| | n | 0 |

| BLOCK | SSL | #OFF-CELL |
|---|---|---|
| | 1 | 1 |
| | 2 | 0 |
| 2 | 3 | 2 |
| | ⋮ | ⋮ |
| | n | 0 |

⋮

| BLOCK | SSL | #OFF-CELL |
|---|---|---|
| | 1 | 0 |
| | 2 | 0 |
| m | 3 | 1 |
| | ⋮ | ⋮ |
| | n | 2 |

NONVOLATILE MEMORY DEVICE AND METHOD OF DETECTING DEFECTIVE MEMORY CELL BLOCK OF NONVOLATILE MEMORY DEVICE

CROSS-REFERENCE TO RELATED APPLICATION

This application is based on and claims priority under 35 U.S.C. § 119 to Korean Patent Application No. 10-2020-0101411, filed on Aug. 12, 2020, in the Korean Intellectual Property Office, the disclosure of which is incorporated by reference herein in its entirety.

BACKGROUND

The inventive concept relates to a memory device, and more particularly, to a nonvolatile memory device and a method of detecting a defective memory cell block in the nonvolatile memory device.

A memory device for storing data is classified into volatile memory devices and nonvolatile memory devices. A flash memory device, which is an example of a nonvolatile memory device, may be used in mobile phones, digital cameras, personal digital assistants (PDAs), portable computer devices, stationary computer devices, and other devices.

When a nonvolatile memory performs an erase operation by applying an erase command voltage through a substrate, whether leakage has occurred in a word line may be determined by determining a voltage level of a word line where a leakage current has occurred and a voltage level of a normal word line after performing the erase operation. However, when a nonvolatile memory performs a gate induced drain leakage (GIDL) erase operation, a difference in voltage levels of a leakage word line and a normal word line is not large, making it difficult to detect a memory cell block including the leakage word line.

SUMMARY

The inventive concept provides a nonvolatile memory device in which a defective memory cell block is detected after a gate induced drain leakage (GIDL) erase operation and an operating method of the nonvolatile memory device.

According to an aspect of the disclosure, there is provided a method of detecting a defective memory cell block in a nonvolatile memory system, the method comprising: performing, after an erase operation, a read operation on one or more memory cells included in a target memory cell block based on an off-cell detection voltage that is different from a read reference voltage; counting a number of hard off-cells having a higher threshold voltage than the off-cell detection voltage among the one or more memory cells based on a result of performing the read operation; and identifying whether the target memory cell block is a defective memory cell block based on the number of hard off-cells.

According to another aspect of the disclosure, there is provided a nonvolatile memory system comprising: a memory device including a plurality of memory cell blocks; and a memory controller comprising: a command generator configured to output an off-cell detection command signal to direct the memory device to perform a hard off-cell detection operation after the memory device performs an erase operation; and a defective memory cell block identifier configured to output a signal indicating whether a target memory cell block is a defective memory cell block based on a number of hard off-cells among one or more memory cells included in the target memory cell block according to the off-cell detection command signal, wherein the memory device is configured to perform, based on the off-cell detection command signal, a read operation on the one or more memory cells based on an off-cell detection voltage that is different from a read reference voltage.

According to another aspect of the disclosure, there is provided a nonvolatile memory controller comprising: a memory storing one or more instruction; and a processor configured to execute the one or more instructions to implement: a command generator configured to output an off-cell detection command signal to direct the memory device to perform a hard off-cell detection operation after the memory device performs an erase operation; and a defective memory cell block identifier configured to output a signal indicating whether a memory cell block including a target cell string is a defective memory cell block based on a number of hard off-cells among one or more memory cells included in a target memory cell block according to the off-cell detection command signal.

According to another aspect of the disclosure, there is provided a memory device comprising: a voltage generating circuit configured to apply an off-cell detection voltage that is different from a read reference voltage to a target memory cell to perform a hard off-cell detection operation on the target memory cell after the memory device performs an erase operation; a sensing amplifier configured to receive an output current from the target cell string based on the off-cell detection voltage; and a control circuit configured to output a signal indicating that the target memory cell is a hard off-cell based on the output current of the target memory cell being less than a threshold current.

According to another aspect of the disclosure, there is provided a method of detecting an hard off-cell comprising: applying an off-cell detection voltage that is different from a read reference voltage to a target memory cell to perform a hard off-cell detection operation on the target memory cell after the memory device performs an erase operation; sensing an output current from the target memory cell based on the off-cell detection voltage; and outputting a signal indicating that the target memory cell is the hard off-cell based on the output current of the target memory cell being less than a threshold current.

BRIEF DESCRIPTION OF THE DRAWINGS

Embodiments of the inventive concept will be more clearly understood from the following detailed description taken in conjunction with the accompanying drawings in which:

FIG. 12A is a table comparing a voltage difference between a target word line to be detected and a channel as a voltage is applied to each of a leakage word line and a normal word line, according to an example embodiment;

FIG. 15 is a table showing off-cell information stored in an off-cell information storage block, according to an example embodiment;

DETAILED DESCRIPTION OF THE EMBODIMENTS

Hereinafter, exemplary embodiments of the inventive concept will be described in detail with reference to the accompanying drawings.

Figure 1:
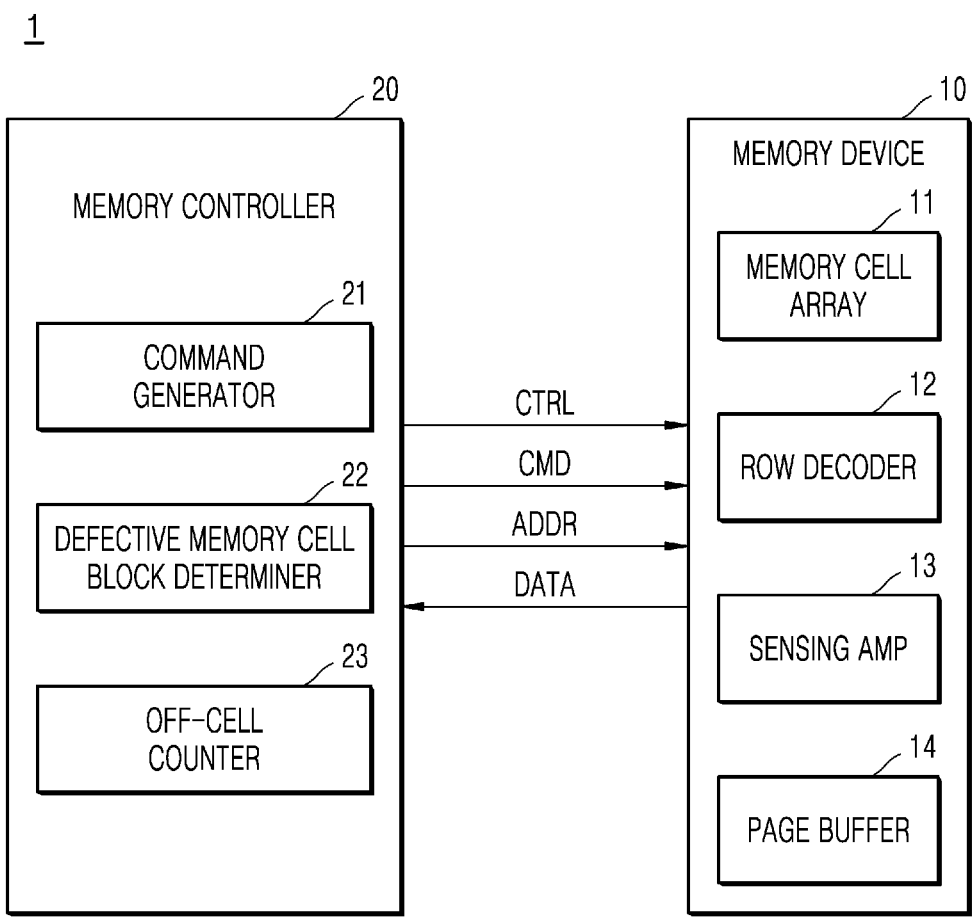
FIG. 1 is a block diagram of a memory system according to an example embodiment.

FIG. 1 is a schematic structural block diagram of a memory system according to an example embodiment.

Referring to FIG. 1, the memory system 1 may include a memory device 10 and a memory controller 20, and the memory device 10 may include a memory cell array 11, a row decoder 12, a sensing amplifier (amp) 13, and a page buffer 14, and the memory controller 20 may include a command generator 21, a defective memory cell block determiner 22, and an off-cell counter 23.

According to an example embodiment, the memory controller 20 may include a processor and a random access memory (RAM). The processor may include a central processing unit or a microprocessor, and the like, and may control an overall operation of the memory controller. The processor may communicate with a memory device 10 through the memory interface. The processor may use the RAM as an operation memory, cache memory, or buffer memory to control the memory device.

The memory controller 20 may control program operations, read operations, and erase operations on the memory device 10 by providing an address, a command, and a control signal to the memory device 10 to read data stored in the memory device 10 or write data to the memory device 10 in response to a read/write request from a host. Also, data for a program operation and read data may be transmitted or received between the memory controller 20 and the memory device 10. However, the inventive concept is not limited thereto, and as such, according to an example embodiment, hard off-cell counting information and hard off-cell information may be transmitted or received in a defective memory cell block detecting operation.

A defective memory cell block detecting operation may be an operation of detecting a subject memory cell block on which data writing or reading has become impossible due to a defect in a word line of the subject memory cell block and/or a memory cell connected to the word line. For example, a current leakage occurring in a memory cell may cause a voltage applied to a substrate to leak and be applied to a word line. When a target memory cell block is determined to be a memory cell block on which no writing or reading may be performed, the memory controller 20 may designate the memory cell block as a defective memory cell block and exclude the defective memory cell block during a reading or writing operation of the memory device 10.

The memory cell array 11 may include a plurality of memory cells. For example, the plurality of memory cells may be, for example, flash memory cells. Hereinafter, the examples embodiments will be described based on NAND flash memory cells included as the plurality of memory cells. However, the inventive concept is not limited thereto, and in another example embodiment, the plurality of memory cells may be resistive memory cells such as resistive read only memory (ReRAM), phase change RAM (PRAM), or magnetic RAM (MRAM).

The row decoder 12 is a component connected to the memory cell array 11 via a plurality of word lines and may apply a read reference voltage or an off-cell detection voltage to memory cells of a target cell string. The row decoder 12 may apply a read reference voltage or an off-cell detection voltage to memory cells based on a command of the memory controller 20, and may specify, based on a word line address, a word line to which a voltage is to be applied. A target cell string is a cell string, the number of hard off-cells of which is to be counted, from among memory cell blocks. According to an example embodiment, the target cell string may be a single cell string, but is not limited thereto and as such, according to another example embodiment, the target cell string may also include a plurality of cell strings. For example, a target cell string may be a set of cell strings that share a string select line in a memory cell block. Hereinafter, a target cell string refers to a single cell string or a plurality of cell strings, on which an operation of counting hard off-cells is to be performed.

The sensing amp 13 may be connected to the memory cell array 11 and detect data stored in the memory cell array 11. The sensing amp 13 may compare a current output from the memory cell array 11 with a reference current, and may determine a status of data written to a target memory cell based on a result of the comparison. For example, the sensing amp 13 may include a comparator, and when a current level output from the memory cell array 11 is higher than a reference current, a target memory cell may be determined to be an on-cell, and when the output current level is lower than a reference current, the target memory cell may be determined to be an off-cell.

The page buffer 14 may include a plurality of latches, and may store in at least some of the plurality of latches, hard off-cell information based on a status of data of a target memory cell output from the sensing amp 13. According to an example embodiment, the page buffer 14 may store the hard off-cell information temporarily. According to an example embodiment, the page buffer 14 may count the number of hard off-cells from among memory cells of a target cell string.

Referring to FIG. 1, the page buffer 14 and the sensing amp 13 are included as separate components but are not limited thereto, and the page buffer 14 may include the sensing amp 13 and the page buffer 14 may detect data stored in the memory cell array 11. Meanwhile, in a program operation, the page buffer 14 may operate as a write driver to input data to be stored in the memory cell array 11.

The command generator 21 of the memory controller 20 may generate an off-cell detection command signal to direct the memory device 10 to perform a hard off-cell detection operation after performing an erase operation. An off-cell detection command signal may be a code including a series of bits, and the memory device 10 may perform an off-cell detection operation to detect a defective memory cell block based on receiving an off-cell detection command signal.

The off-cell counter 23 of the memory controller 20 may count the number of hard off-cells in some memory cells based on hard off-cell information detected from the some memory cells of a target memory cell block according to an off-cell command signal. Hard off-cell information refers to information generated as a result of a read operation performed on a target cell string, and may indicate whether a memory cell to be read is a hard off-cell.

The defective memory cell block determiner 22 of the memory controller 20 may determine whether a memory cell block including a target cell string is a defective memory cell block by receiving hard off-cell counting information from the off-cell counter 23 or the page buffer 14. For example, in response to the number of hard off-cells counted from a target cell string, the number exceeding the reference number of off-cells, a memory cell block including the target cell string may be determined to be a defective memory cell block.

In FIG. 1, the command generator 21, the off-cell counter 23, and the defective memory cell block determiner 22 of the memory controller 20 are illustrated as different components, but they may also refer to software modules included in single hardware and performing different functions. Also, according to another example embodiment, the memory controller 20 may include other components in addition to the command generator 21, the off-cell counter 23, and the defective memory cell block determiner 22.

Figure 2:
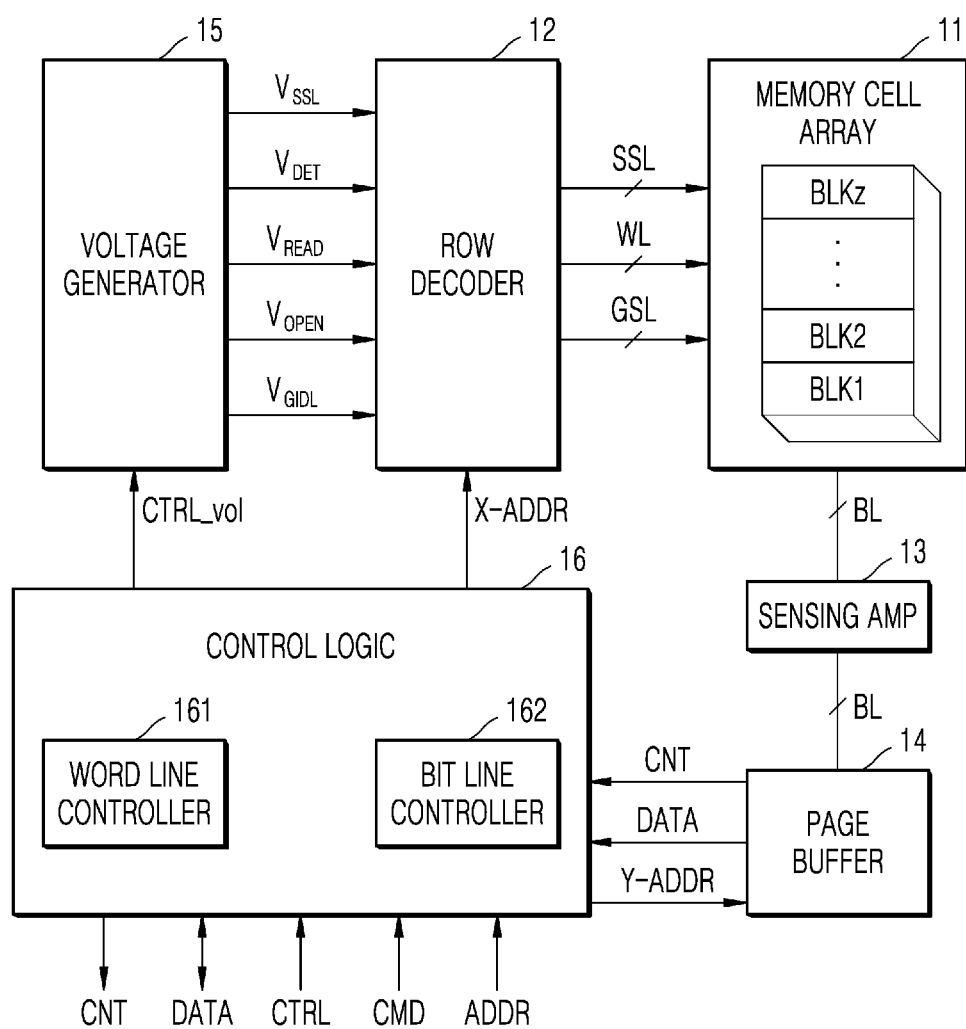
FIG. 2 is a block diagram of a memory device according to an example embodiment.

FIG. 2 is a schematic structural block diagram of the memory device 10 according to an example embodiment.

Referring to FIG. 2, the memory device 10 may include a memory cell array 11, a row decoder 12, a sensing amp 13, a page buffer 14, a voltage generator 15, and a control logic 16. The memory cell array 11 according to the example embodiment may be an example of the memory cell array 11 of FIG. 1, and the configuration of the memory device 10 is not limited to FIG. 2, and may further include other components such as a data input/output unit. According to an example embodiment, one or more of the elements of the memory device 10 and the memory controller may be implemented by a circuit.

The memory cell array 11 may include a plurality of memory cell blocks BLK1, BLK2, . . . , BLKz, and each memory cell block may include a plurality of cell strings including a plurality of memory cells. The memory device 10 according to the inventive concept may perform a hard off-cell detection operation on some memory cells of a target memory cell block, and the hard off-cell detection operation may be performed in units of cell strings. Hereinafter, a target cell string may be referred to as a set of memory cells on which a hard off-cell detection operation is performed. The memory cell array 11 may be connected to the row decoder 12 via word lines WL, string select lines SSL, and ground select lines GSL. Each memory cell may store one or more bits, and in detail, each memory cell may be used as a single-level cell, a multi-level cell, or a triple-level cell.

The control logic 16 may output various signals to write data to the memory cell array 11, read data from the memory cell array 11, or erase data stored in the memory cell array 11, based on a command CMD, an address ADDR, and a control signal CTRL received from the memory controller 20. Furthermore, the control logic 16 may output various signals for detecting an off-cell by receiving an off-cell detection command. Accordingly, the control logic 16 may control various operations in the memory device 10 overall.

Various control signals output from the control logic 16 may be provided to the voltage generator 15, the row decoder 12, and the page buffer 14. In detail, the control logic 16 may provide a voltage control signal CTRL_vol to the voltage generator 15, a row address (X-ADDR) to the row decoder 12, and a column address (Y-ADDR) to the page buffer 14. However, the inventive concept is not limited thereto, and the control logic 16 may further provide other control signals to the voltage generator 15, the row decoder 12, and the page buffer 14.

The voltage generator 15 may generate various types of voltages for performing program, read, erase, and off-cell read operations on the memory cell array 11 based on a voltage control signal. In detail, the voltage generator 15 may apply a read reference voltage $V_{READ}$ to a target memory cell, from which data is to be read, from among memory cells connected to the word lines WL. Also, the voltage generator 15 may apply a read reference voltage $V_{READ}$ to the other memory cells than the target memory cell. Moreover, the voltage generator 15 may apply a channel open voltage $V_{OPEN}$ for opening a channel between a source end and a drain end may be applied. In addition, the voltage generator 15 may further generate a string select line driving voltage ($V_{SSL}$) for driving the string select lines SSL and a ground select line driving voltage for driving the ground select lines GSL. In addition, the voltage generator 15 may further generate a gated induced drain leakage (GIDL) erase voltage ($V_{GIDL}$) and an off-cell detection voltage $V_{DET}$ for detecting a hard off-cell, which are to be provided to the memory cell array 11.

In addition, the voltage generator 15 according to an example embodiment may apply a word line voltage, a bit line voltage, a string select line voltage, and a ground select line voltage to the memory cell array 11 to perform an erase operation.

The row decoder 12 may specify a word line on which an off-cell detection operation is to be performed, from among the word lines WL, in response to a row address X-ADDR received from the control logic 16. In detail, an off-cell detection voltage $V_{DET}$ may be applied to a target word line on which an off-cell detection operation is to be performed, and a channel open voltage $V_{OPEN}$ may be applied to the other word lines except the target word line. Also, the row decoder 12 may select some string select lines from among the string select lines SSL or some ground select lines from among the ground select lines GSL to select a target cell string on which off-cell detection is to be performed, in response to a row address X-ADDR received from the control logic 16.

The page buffer 14 may determine a bit line BL on which a hard off-cell detection operation with respect to the memory cell array 11 is to be performed. The page buffer 14 may receive off-cell detection result information from a cell string connected to each bit line BL, and store an off-cell detection result in at least one of the plurality of latches. For example, off-cell detection result information with respect to whether a target memory cell is a hard off-cell may be received from the sensing amp 13, and when the target memory cell is a hard off-cell, the number of hard off-cells may be cumulatively stored in a latch. The page buffer 14 may perform a detection operation on all word lines of a target cell string and transmit hard off-cell number information accumulated in a latch, to the control logic 16.

The sensing amp 13 may receive a current distinguished according to an on or off state of a target memory cell from a target cell string. The sensing amp 13 may compare a current output from the target cell string with a reference current to output whether the target memory cell is on or off. According to an example embodiment, the reference current may be a threshold current. For example, when the output current is lower than the threshold current, a channel of the target memory cell is not opened, and therefore, it may be determined that no current is output from the target cell string. Accordingly, when the output current is lower than the threshold current, the target memory cell may be determined to be a hard off-cell. In contrast, when the output current is equal to or higher than the threshold current, a channel of the target memory cell is opened, and therefore, it may be determined that a current is output from the target cell string. Accordingly, when the output current is equal to or higher than the threshold current, the target memory cell may be determined to be a normal memory cell.

The page buffer 14 and the sensing amp 13 are respectively connected to the plurality of bit lines BL, and when a target cell string includes a plurality of cell strings, the page buffer 14 connected to each bit line may count the number of hard off-cells of each cell string, and a sum of the numbers of hard off-cells may be determined to be the number of hard off-cells of the target cell string. According to an example embodiment the page buffer 14 may output the data (DATA) from the memory cell array 11 and/or the counted number of hard off-cells (CNT) to the control logic 16.

Figure 3:
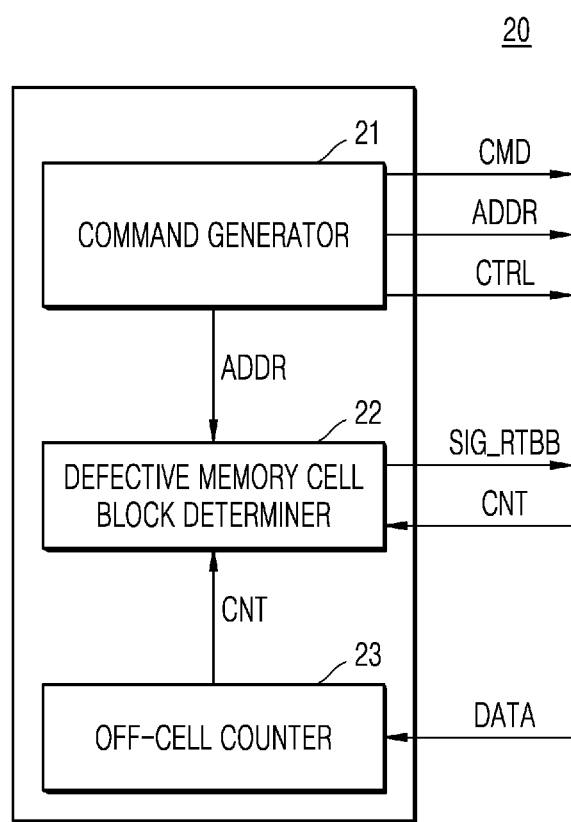
FIG. 3 is a block diagram of a memory controller according to an example embodiment.

FIG. 3 is a schematic structural block diagram of the memory controller 20 according to an example embodiment.

Referring to FIG. 3, the memory controller 20 may include a command generator 21, a defective memory cell block determiner 22, and an off-cell counter 23. The command generator 21 may output a command signal CMD to the memory device 10 in response to a request from a host device, and in response to receiving a request for detecting a defective memory cell block, the command generator 21 may generate an off-cell detection command signal to direct a hard off-cell detection operation. The command generator 21 may output, to the memory device 10 and the defective memory cell block determiner 22, an address ADDR of a target memory cell block and a target cell string, which are subject to detection, together with a command signal CMD. Furthermore, the command generator 21 may output a control signal CTRL for controlling the memory device 10, to the memory device 10. The control signal CTRL may be a control signal for determining a voltage applied from the memory device 10 to a word line; for example, when performing an off-cell detection operation after performing an erase operation, the command generator 21 may set a value between a threshold voltage level of an erased memory cell and a threshold voltage level of a hard off-cell as an off-cell detection voltage, and output a control signal for applying the off-cell detection voltage to the word line.

The off-cell counter 23 may receive hard off-cell information regarding whether a target memory cell is a hard off-cell, from the memory device 10, as data DATA, and while determining whether each of all memory cells of a target cell string is a hard off-cell, the off-cell counter 23 may count hard off-cells of the target cell string. The off-cell counter 23 may generate counting information CNT by counting all hard off-cells of the target cell string and provide the counting information CNT to the defective memory cell block determiner 22.

The defective memory cell block determiner 22 may receive the counting information CNT from the page buffer 14 or the off-cell counter 23, and may determine whether a memory cell block including the target cell string is a defective memory cell block, based on the number of counted hard off-cells. In detail, the defective memory cell block determiner 22 may compare the number of hard off-cells included in the target cell string to the reference number of off-cells corresponding to the target cell string, and when the number of hard off-cells is determined to exceed the reference number of off-cells, the target memory cell block may be determined to be a defective memory cell block. The defective memory cell block determiner 22 that has determined the target memory cell block to be a defective memory cell block may output a signal (SIG defective memory cell block) indicating that the target memory cell block is a defective memory cell block, to the host device and/or the memory device 10, thereby blocking an operation of writing data to or reading data from the target memory cell block. As the memory controller 20 determines the target memory cell block as a defective memory cell block, an uncorrectable error correction code (UECC) during a reading operation may be prevented.

Figure 4:
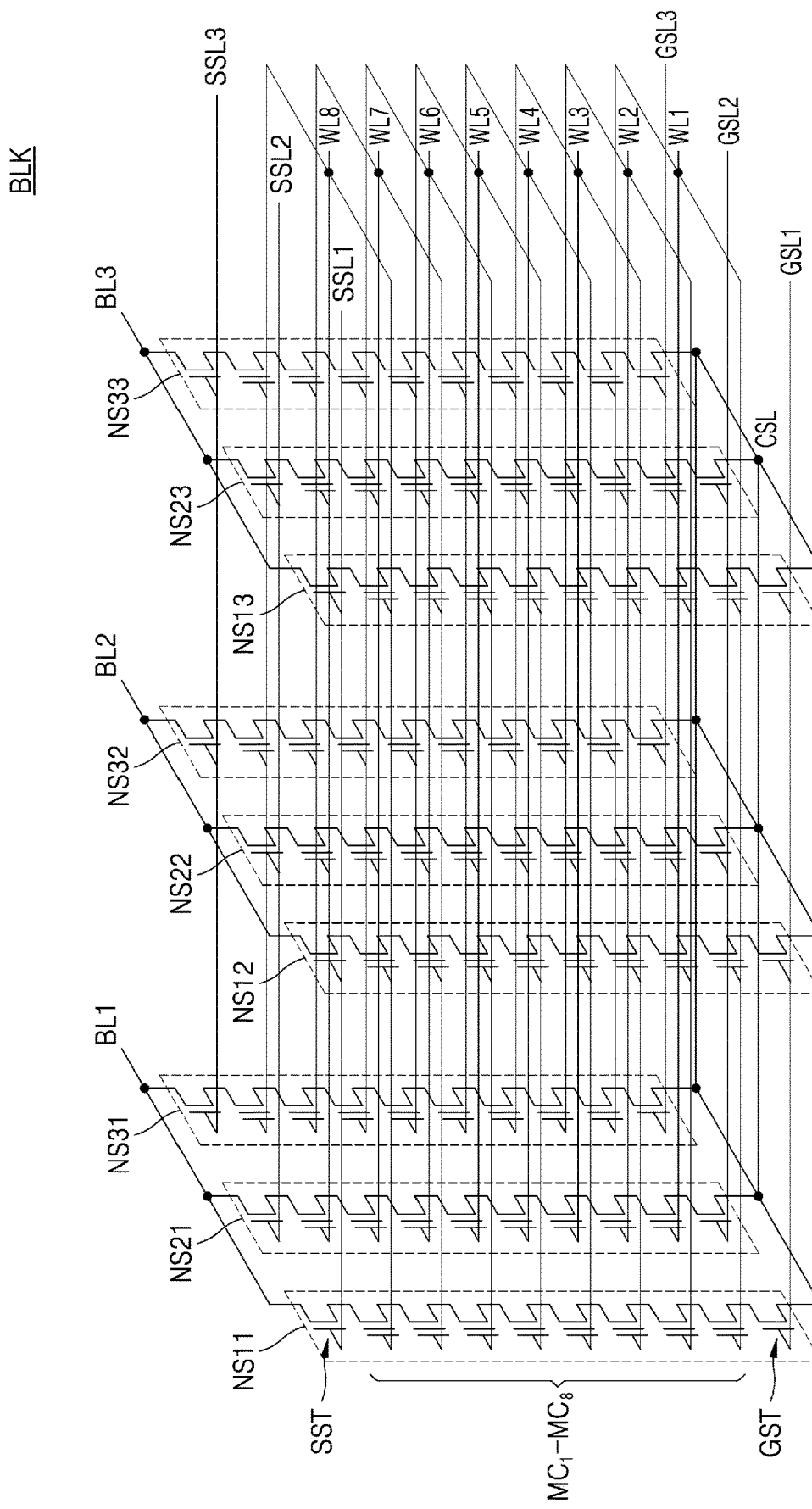
FIG. 4 is a diagram illustrating a vertically stacked memory cell array, according to an example embodiment.

FIG. 4 is a diagram illustrating a memory cell array 11 that is vertically stacked, according to an example embodiment.

Referring to FIG. 4, a memory block BLK may include NAND strings NS11 through NS33, first through eighth word lines WL1 through WL8, first through third bit lines BL1 through BL3, ground select lines GSL1 through GSL3, string select lines SSL1 through SSL3, and a common source line CSL. The memory block BLK may correspond to one of the memory blocks BLK1 through BLKz of FIG. 2. The number of NAND strings, the number of word lines, the number of bit lines, the number of ground select lines, and the number of string select lines may be variously modified according to example embodiments.

According to an example embodiment, the NAND strings NS11, NS21, and NS31 may be provided between the first bit line BL1 and the common source line CSL, NAND strings NS12, NS22, and NS32 may be provided between the second bit line BL2 and the common source line CSL and NAND strings NS13, NS23, and NS33 may be provided between the third bit line BL3 and the common source line CSL. Each NAND string (for example, NS11) may include a string select transistor SST, a plurality of memory cells MC1 through MC8, and a ground select transistor GST that are serially connected.

The string select transistor SST is connected to a corresponding string select line from among the string select lines SSL1 through SSL3. The memory cells MC1 through MC8 are respectively connected to the corresponding first through eighth word lines WL1 through WL8. The ground select transistor GST is connected to a corresponding ground select line from among the ground select lines GSL1 through GSL3. The string select transistor SST is connected to a corresponding bit line from among the first through third bit lines BL1 through BL3, and the ground select transistor GST is connected to the common source line CSL.

Figure 5:
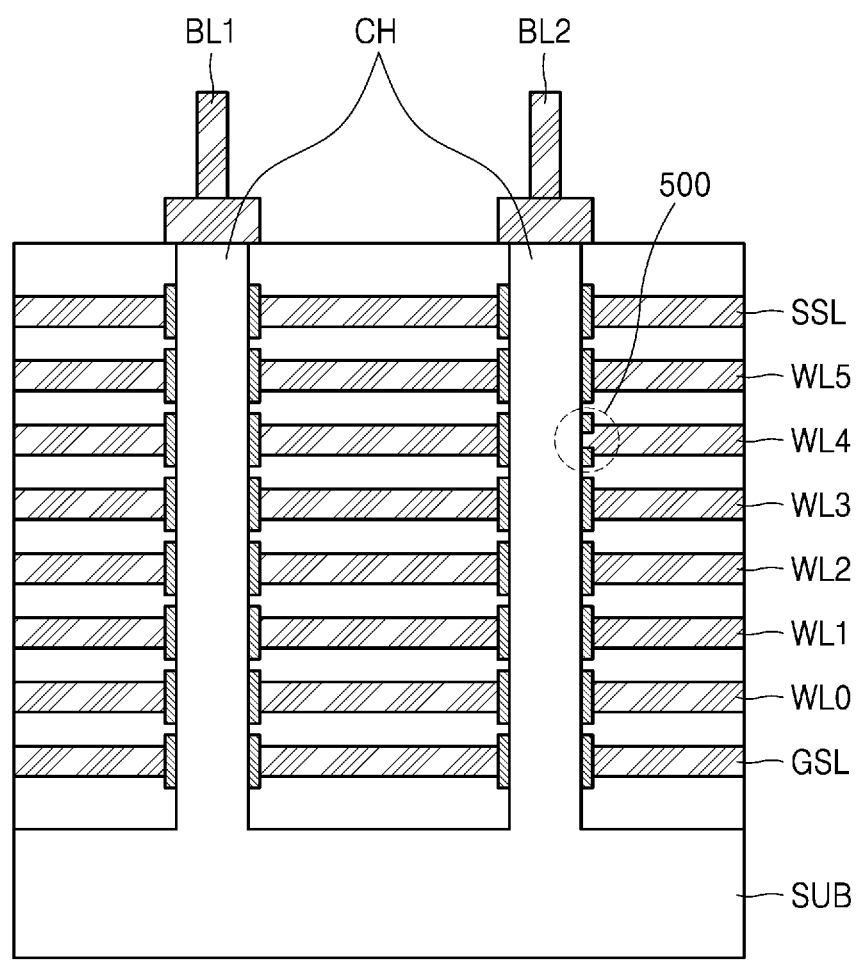
FIG. 5 is a diagram illustrating a cell string including a leakage word line, according to an example embodiment.
Figure 6:
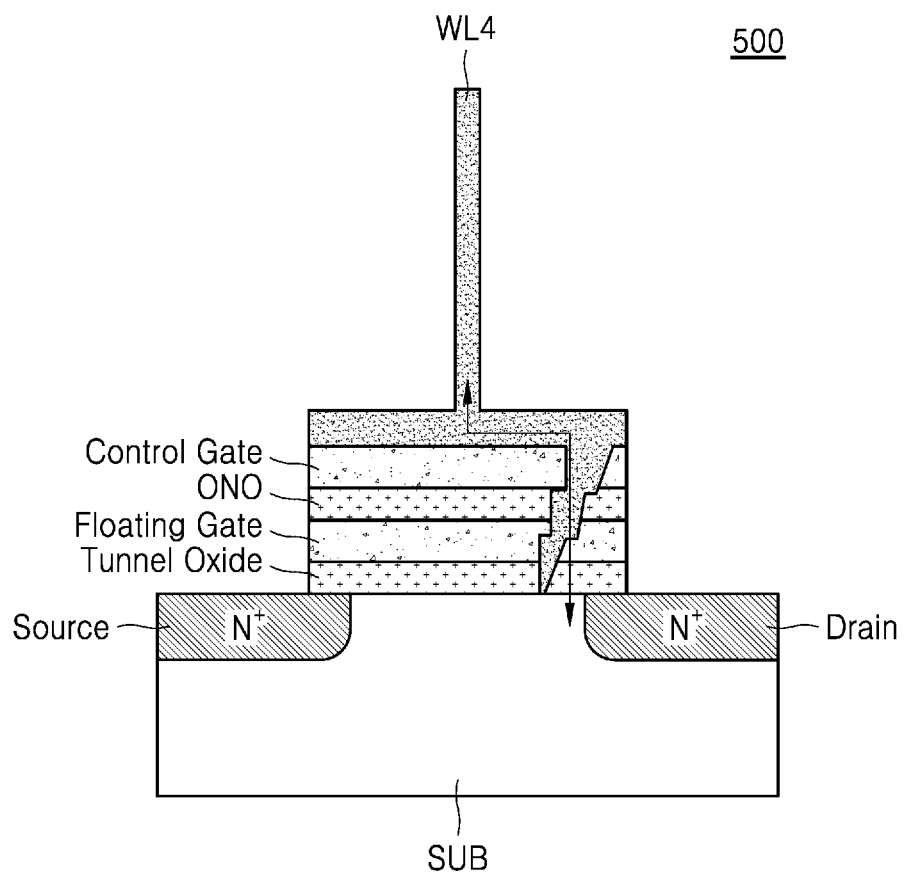
FIG. 6 is a diagram illustrating a memory cell according to an example embodiment, in which, leakage has occurred between a word line and a channel.

FIG. 5 is a diagram illustrating a cell string including a leakage word line, according to an example embodiment. FIG. 6 is a diagram illustrating a memory cell in which leakage has occurred between a word line and a channel, according to an example embodiment.

Referring to FIG. 5, according to an example embodiment, a string select line SSL may be specified in a memory cell block, and the memory device 10 may select a target cell string. For example, as the string select line SSL of FIG. 5 is specified, a voltage for performing a read, program, or erase operation may be applied, and accordingly, the memory device 10 may perform a read, program, or erase operation on the target cell string.

The memory device 10 may apply an erase command voltage to the memory cell array 11 via a bit line, and when performing an erase operation based on GIDL, an erase operation may be performed using a smaller current than when applying an erase command voltage via a substrate SUB.

According to a GIDL erase method, a transistor of the ground select line GSL and/or the string select line SSL located at both ends of a cell string may perform an operation of a GIDL transistor, and when an erase command voltage is applied to a drain electrode (or a source electrode) of the GIDL transistor, a GIDL voltage of a lower level than the erase command voltage may be applied to a gate electrode. When a voltage difference between the drain electrode and the gate electrode of the GIDL transistor is equal to or higher than a voltage level at which a GIDL current may be generated, the GIDL current is generated and holes according to the GIDL current are formed in a channel area CH of the cell string, thereby charging the channel area. Accordingly, the memory device 10 according to the inventive concept may perform an erase operation through a bit line and/or the substrate SUB based on GIDL.

A memory cell may be deteriorated in an operation of performing programming, reading, or erasing data on the memory cell array 11, and accordingly, a leakage current may occur between a word line and a channel. That is, when a voltage for reading or writing is applied to a word line, a current may leak to a channel, and a memory cell may malfunction. For instance, in the memory cell, a determination of whether electrons are to be tunneled in a floating gate is based on a difference in potentials between the channel and a control gate, and since the current may leak to the channel, the memory cell may not function properly. Hereinafter, a word line, between which and a channel leakage is caused, is referred to as a leakage word line, and a memory cell where leakage occurs is referred to as a leakage memory cell 500.

For example, referring to FIG. 5, when writing data to a leakage memory cell 500 to which a leakage word line is connected, a positive voltage is to be applied through the leakage word line and a drain end, and electrons are to be tunneled to a floating gate based on a difference in potentials between a channel and a control gate. However, as leakage is caused between the leakage word line and the channel, a high potential difference between the channel and the control gate is not induced, thus preventing writing data to the corresponding memory cell.

Figure 7A:
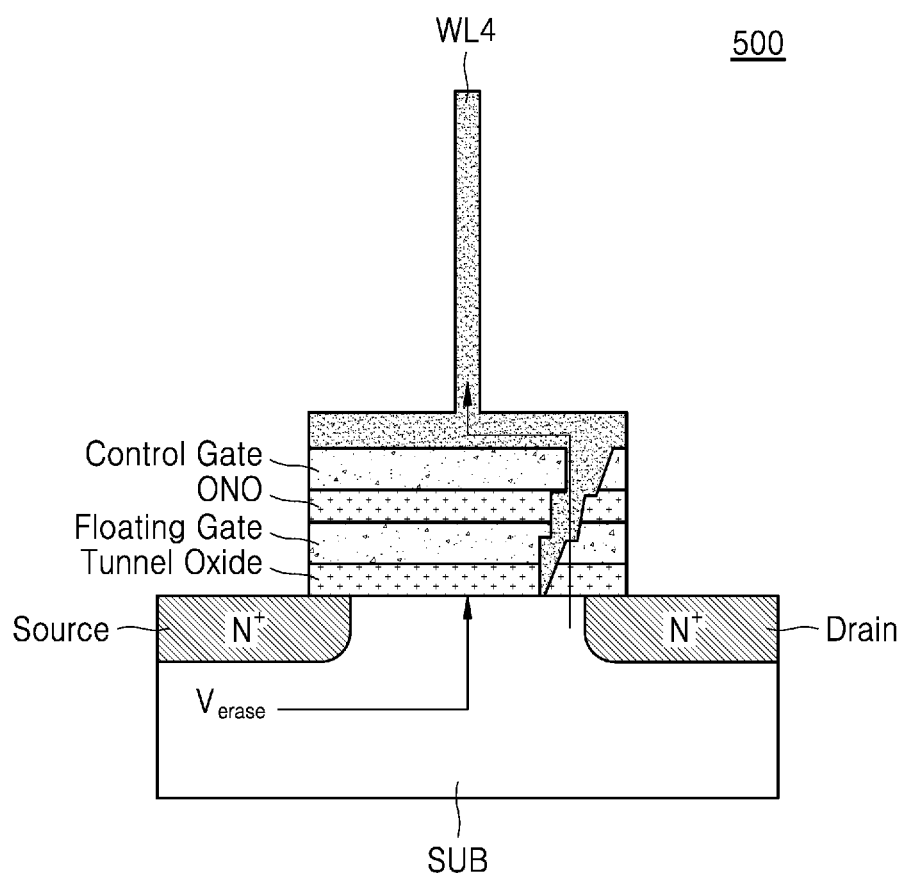
FIG. 7A is a diagram illustrating a memory cell according to a comparative example to which an erase command voltage is input via a substrate.
Figure 7B:
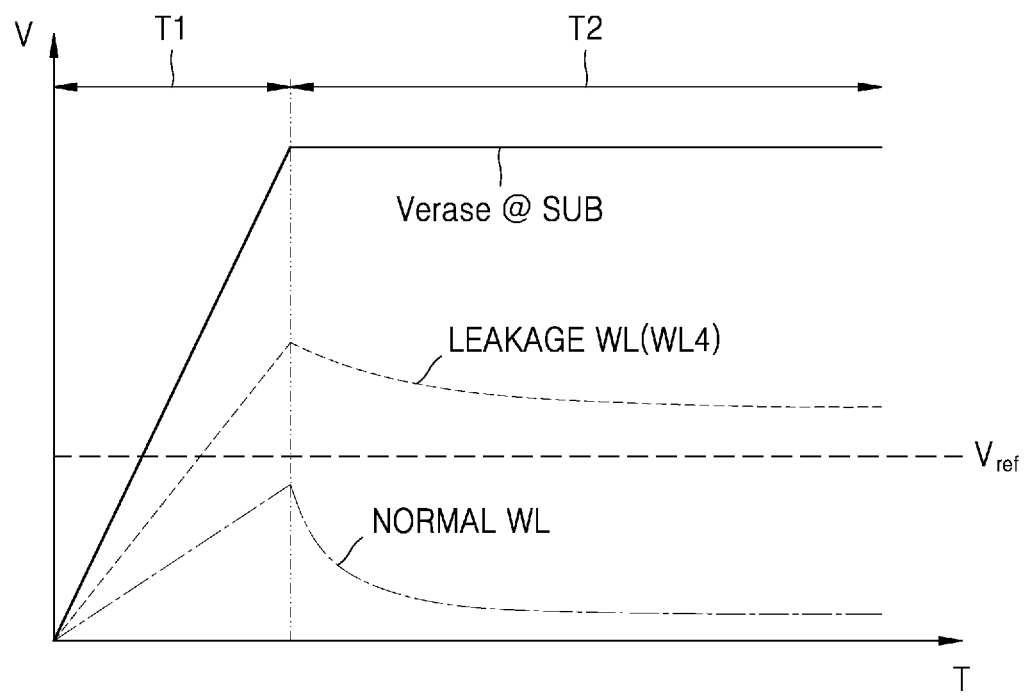
FIG. 7B is a diagram illustrating voltage levels of a leakage word line and a normal word line according to the application of the erase command voltage.

FIG. 7A is a diagram illustrating a memory cell to which an erase command voltage is input via a substrate, according to a comparative example, and FIG. 7B is a diagram illustrating voltage levels of a leakage word line and a normal word line according to the application of the erase command voltage.

The memory device 10 may apply an erase command voltage to a memory cell via a channel hole. When an erase command voltage is applied to a normal memory cell, electrons trapped in a floating gate may go out of the floating gate through a tunnel oxide layer, thus enabling the memory device 10 to erase data written to the normal memory cell. When an erase command voltage is applied to a normal memory cell, as a word line WL and a channel hole SUB are separated, it is ideal when a word line voltage is not affected despite application of an erase command voltage $V_{erase}$ to the normal memory cell through the channel hole SUB. However, when an erase command voltage of a high level is applied as in a first time period of FIG. 7B, a voltage of a normal word line may also increase accordingly.

When an erase command voltage $V_{erase}$ is applied to the leakage memory cell 500 connected to a leakage word line WL4, a leakage current is generated between the channel hole SUB and the leakage word line WL4, and thus, a portion of the erase command voltage $V_{erase}$ through the channel hole SUB may be applied to the leakage word line WL4. Accordingly, while performing an erase operation as in a first time period of FIG. 7B, a higher voltage may be applied to the leakage word line WL4 than the normal word line.

In the first time period T1 of FIG. 7B, when the memory device 10 starts applying a high-level erase command voltage $V_{erase}$ to a memory cell via the channel hole SUB, a certain voltage may also be applied to the normal word line. However, a higher voltage than the voltage applied to the normal word line may be applied to the leakage word line WL4, due to leakage between the substrate SUB and the leakage word line WL4. When the memory device 10 applies an erase command voltage $V_{erase}$ to the memory device 10 in a second time period T2, a portion of the applied voltage may leak through a pass transistor connected to a word line. Here, in the normal word line, the voltage leaking through the pass transistor may be more than the voltage applied as the erase command voltage $V_{erase}$, and thus, a voltage level of the normal word line may decrease. In contrast, as a portion of a voltage may also leak from the leakage word line WL4 through a pass transistor, a voltage of the leakage word line WL4 may also decrease. However, as a higher voltage is applied to the leakage word line than to the normal word line due to a leakage current, the voltage leaking from the leakage word line to the pass transistor may be less than that leaking from the normal word line.

After the erase command voltage $V_{erase}$ is applied in the second time period T2, the memory device 10 may measure a voltage of each word line, and determine a word line having a voltage higher than a reference voltage $V_{ref}$ as the leakage word line WL4. That is, the memory device 10 may measure voltage levels of word lines while the erase command voltage $V_{erase}$ is being applied, and determine whether to determine a memory cell block as a defective memory cell block, based on the voltage levels of the word lines.

Figure 8A:
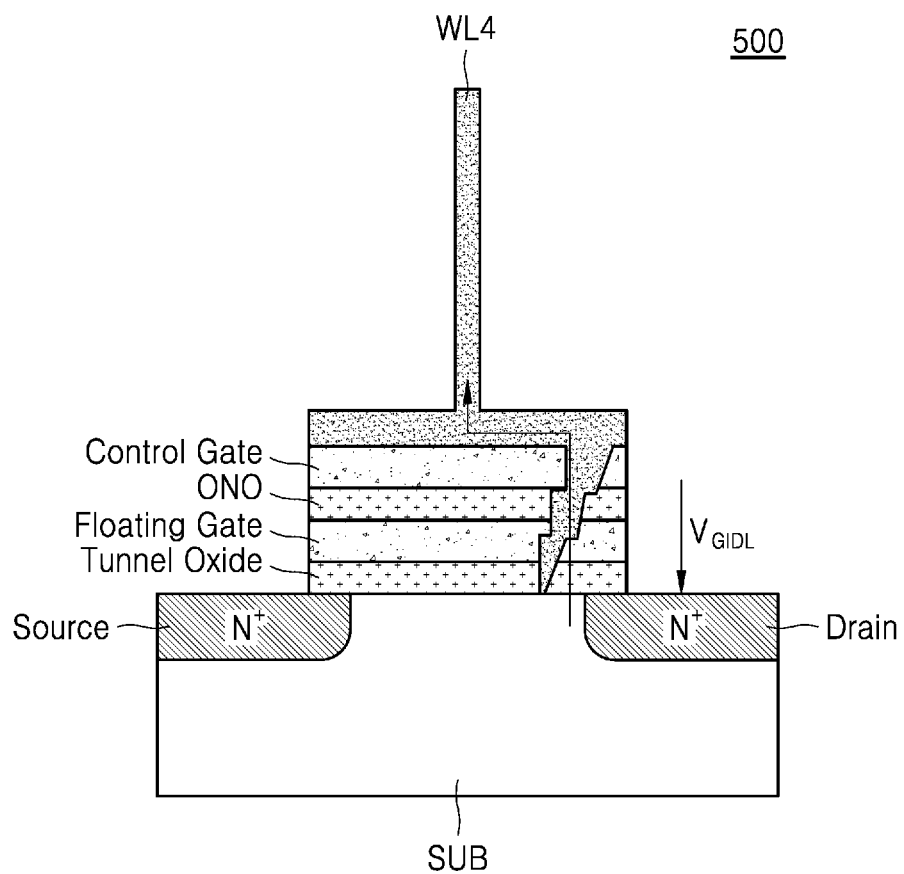
FIG. 8A is a diagram illustrating a memory cell according to an example embodiment, to which a gate induced drain leakage (GIDL) erase command voltage is input.
Figure 8B:
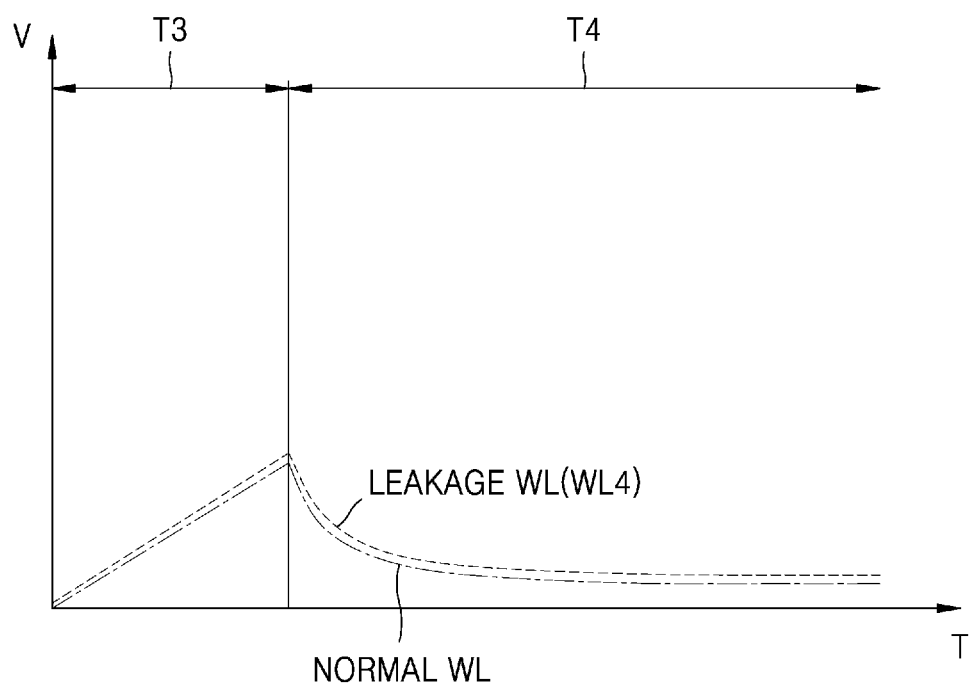
FIG. 8B is a diagram illustrating a voltage level of a leakage word line and a normal word line according to the application of the GIDL erase command voltage.

FIG. 8A is a diagram illustrating a memory cell to which a GIDL erase command voltage $V_{GIDL}$ is input, according to an example embodiment, and FIG. 8B is a diagram illustrating a voltage level of a leakage word line WL4 and a normal word line according to the application of the GIDL erase command voltage.

The memory device 10 according to an example embodiment may apply an erase command voltage via a bit line, and perform an erase operation on memory cells of a target cell string based on GIDL. By applying the erase command voltage, the memory device 10 may induce a channel to be formed between a drain end and a source end, and accordingly, electrons trapped in a floating gate may leak to the outside through a tunnel oxide layer. When a GIDL erase command voltage $V_{GIDL}$ is applied to a normal memory cell, a word line and a channel hole are separated. However, due to the application of the GIDL erase command voltage $V_{GIDL}$, a certain voltage increase may occur in a normal word line as in a third time period of FIG. 8B.

As illustrated in FIG. 8A, when a GIDL erase command voltage $V_{GIDL}$ is applied to the leakage memory cell 500 connected to the leakage word line WL4, a leakage current is generated, and thus, a portion of the GIDL erase command voltage $V_{GIDL}$ may be applied to the leakage word line WL4. However, unlike FIG. 7B, the GIDL erase command voltage $V_{GIDL}$ may be a very small voltage level compared to the erase command voltage of FIG. 7B, and a leakage current according to the GIDL erase command voltage $V_{GIDL}$ may also be very small.

In a third time period (T3) of FIG. 8B, when the memory device 10 starts applying a GIDL erase command voltage $V_{GIDL}$ to a cell string via a bit line, a certain voltage may be applied to a normal word line, and as the GIDL erase command voltage $V_{GIDL}$ of a low level is applied, a voltage of a similar level as that applied to the normal word line may be applied to the leakage word line WL4. When the memory device 10 applies an erase command voltage to the memory device 10 in a fourth time period T4, a portion of the applied voltage may leak through a pass transistor connected to a word line. Here, as the GIDL erase command voltage $V_{GIDL}$ has a low level, a voltage level of the leakage word line WL4 may be similar to that of the normal word line.

Accordingly, when the memory device 10 performs an erase operation by applying a GIDL erase command voltage $V_{GIDL}$, while performing the erase operation, a difference in voltage levels between the leakage word line WL4 and the normal word line may not be so great as to detect the leakage word line WL4. That is, it may be difficult to detect a defective memory cell block from among memory cell blocks on which an erase operation is performed by applying a GIDL erase command voltage $V_{GIDL}$ by using the method of determining a defective memory cell block described above with reference to FIGS. 7A and 7B. Accordingly, in a method of detecting a defective memory cell block described below, a defective memory cell block is detected when the memory device 10 performs an erase operation by applying a GIDL erase command voltage $V_{GIDL}$ having a low voltage level, and thus, an erase operation described below will be assumed to be an erase operation performed based on the GIDL erase command voltage $V_{GIDL}$.

Figure 9:
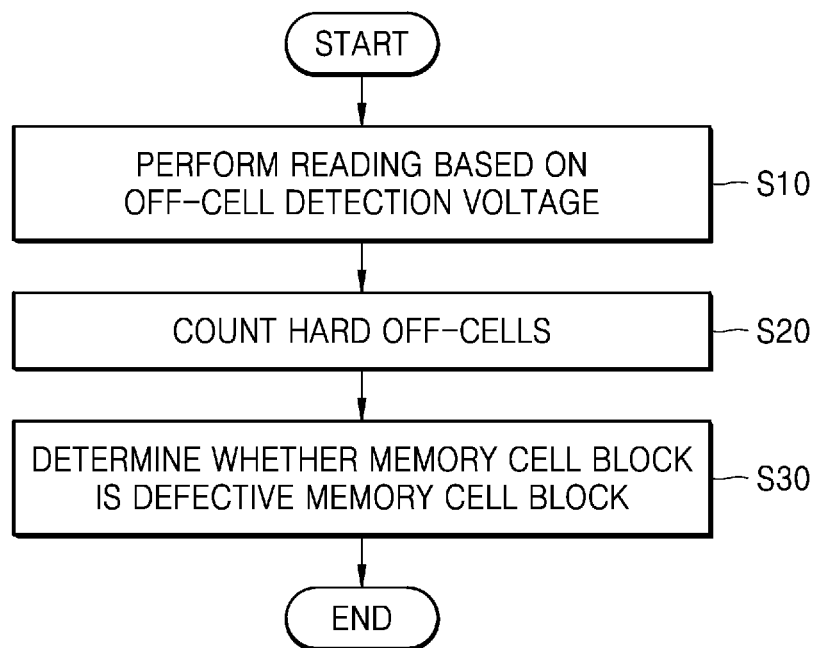
FIG. 9 is a flowchart of a method of detecting a defective memory cell block, according to an example embodiment.

FIG. 9 is a flowchart of a method of detecting a defective memory cell block, according to an example embodiment.

Referring to FIGS. 1 and 9, after performing an erase operation, a nonvolatile memory system determines whether there is a hard off-cell in a target cell string, and then may determine whether a target memory cell block is a defective memory cell block based on the number of hard off-cells of the target cell string. A hard off-cell may be a memory cell having a threshold voltage for generating a current channel between a drain end and a source end due to leakage in a channel hole, the threshold voltage being higher than a threshold voltage of a normal memory cell.

In operation S10, after performing an erase operation, the memory device 10 may perform a read operation on a plurality of memory cells connected to a target cell string, based on an off-cell detection voltage that is different from a read reference voltage. The read reference voltage may be a voltage input to a target word line to be read, to distinguish an off-cell to which no data is written, from an on-cell to which data is written, during a read operation. The off-cell detection voltage may be a voltage input to a target word line to be detected, to distinguish a hard off-cell from a normal memory cell based on a reference voltage that is different from the read reference voltage.

In operation S20, the memory system may determine whether a target memory cell is a hard off-cell based on a result of performing the read operation and count the number of hard off-cells of the target cell string. A result of performing a read operation may be information indicating whether a channel between a source end and a drain end of a target memory cell is opened, by applying an off-cell detection voltage to the target memory cell. When a channel of the target memory cell is not opened, the memory system may determine the target memory cell to be a hard off-cell.

In operation S30, the memory system may determine whether a memory cell block including the target cell string is a defective memory cell block based on the number of counted hard off-cells. When the memory controller 20 has determined that the memory cell block is a defective memory cell block, the memory controller 20 may transmit, to the memory device 10 or a host device, a signal indicating that the memory cell block is a defective memory cell block, thereby preventing writing or reading of data to or from the memory cell block. Accordingly, the memory system according to the inventive concept may prevent UECC caused by incorrectly reading data from a hard off-cell.

Figure 10:
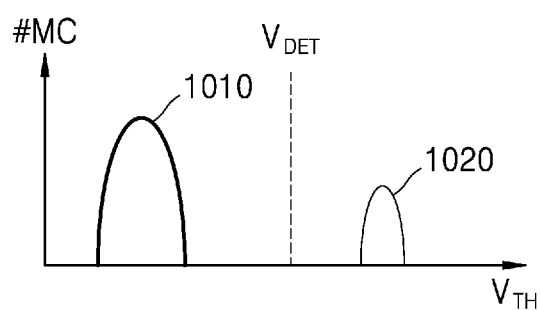
FIG. 10 is a diagram illustrating threshold voltage levels of a normal memory cell, from which data is erased, and a hard off-cell, according to an example embodiment.

FIG. 10 is a diagram illustrating threshold voltage levels of a normal memory cell, from which data is erased, and a hard off-cell, according to an example embodiment.

The command generator 21 of the memory controller 20 may generate an off-cell detection command signal in response to receiving a defective memory cell block detection command from a host. An off-cell detection command signal may be a code including a series of bits, and may be a command signal directing the memory device 10 to perform a hard off-cell detection operation. In addition, the command generator 21 may generate a command to set an off-cell detection voltage such that the memory device 10 performs a hard off-cell detection operation.

Referring to FIG. 10, a threshold voltage of a hard off-cell 1020 may have a higher voltage level than a memory cell 1010 that is normally erased, and the memory cell 1010, which is normally erased, may have a threshold voltage of a same level as that of a memory cell to which data is not written. Accordingly, when the memory device 10 has received an off-cell detection command signal, the voltage generator 15 may output, as an off-cell detection voltage, a voltage between the threshold voltage of the memory cell 1010, which is normally erased, and the threshold voltage of the hard off-cell 1020, and as the row decoder 12 applies the off-cell detection voltage to a target word line, the memory device 10 may determine whether a target memory cell connected to the target word line is a hard off-cell. Here, by applying a channel open voltage to the other word lines except for the target word line, a current channel between a source end and a drain end of the other memory cells than the target memory cell may be opened.

Figure 11:
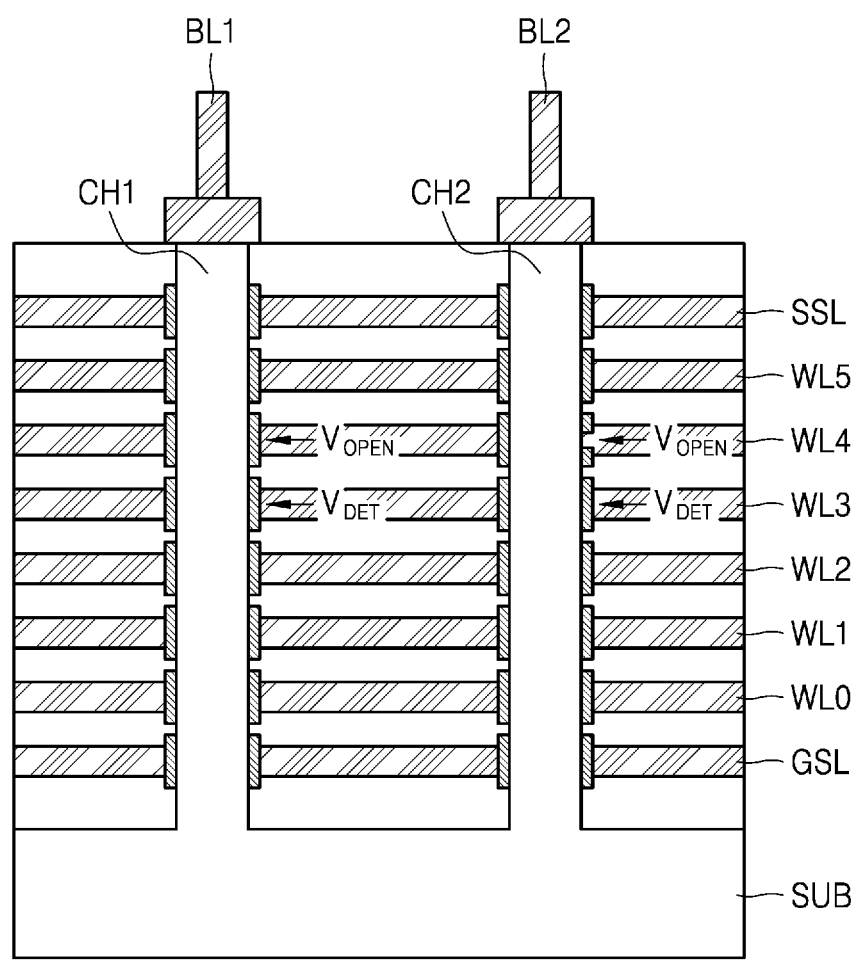
FIG. 11 is a diagram illustrating a cell string in which an off-cell detection voltage and a channel open command voltage are respectively applied to a leakage word line and a normal word line, according to an example embodiment.

FIG. 11 is a diagram illustrating a cell string in which an off-cell detection voltage $V_{DET}$ and a channel open voltage $V_{OPEN}$ are respectively applied to a leakage word line and a normal word line, according to an example embodiment.

Referring to FIG. 11, the memory device 10 may apply an off-cell detection voltage $V_{DET}$ to a target memory cell, which is to be detected as to whether it is a hard off-cell, via a target word line, and may apply a channel open voltage through the other word lines. In FIG. 11, for the convenience of description, a channel open voltage $V_{OPEN}$ applied to only one word line is illustrated. However, the memory device 10 according to the inventive concept may also apply a channel open voltage $V_{OPEN}$ to more than one word line except the target word line or all word lines except the target word line.

According to the example of FIG. 11, a first bit line BL1 may be connected to a cell string including memory cells in which no leakage is generated between a channel hole and a word line. However, a second bit line BL2 may be connected to a cell string including a leakage memory cell in which leakage occurred between a channel hole and a word line. Here, cell strings connected to the first bit line BL1 may share a first channel hole CH1, and cell strings connected to the second bit line BL2 may share a second channel hole CH2.

When the memory device 10 applies an off-cell detection voltage $V_{DET}$ to a third word line WL3 to determine whether memory cells connected to the third word line WL3 are hard off-cells, a channel open voltage $V_{OPEN}$ may be applied to the word lines other than the third word line WL3. From among memory cells sharing the first channel CH1, in memory cells that have received the channel open voltage $V_{OPEN}$ via a word line, a current channel may be formed. Here, when a memory cell, which is connected to the third word line WL3 and which is normally erased, receives the off-cell detection voltage $V_{DET}$, the off-cell detection voltage $V_{DET}$ is higher than a threshold voltage of the normally erased memory cell, thus forming current channel. Accordingly, as a current channel is formed in cell strings including normally erased memory cells, a current indicating that a memory cell connected to the third word line WL3 is not a hard off-cell may be output.

On the other hand, in respect of cell strings sharing the second channel CH2, due to the leakage memory cell connected to the fourth word line WL4, the memory device 10 may determine a target memory cell connected to the third word line WL3 to be a hard off-cell.

Figure 12B:
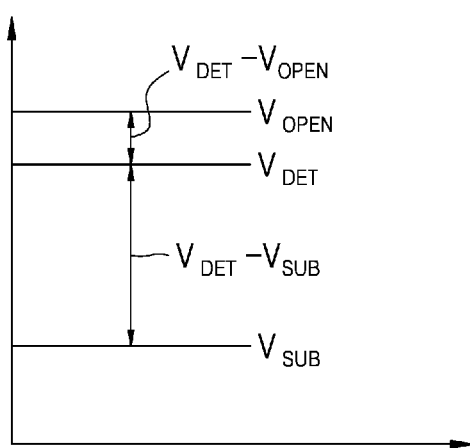
FIG. 12B is a graph showing a voltage level difference among voltages applied to a memory cell array.

FIG. 12A is a table comparing a voltage difference between a target word line to be detected and a channel as a voltage is applied to each of a leakage word line and a normal word line, according to an example embodiment. FIG. 12B is a graph showing a voltage level difference among voltages applied to a memory cell array.

In the memory cell array 11 of FIG. 11 according to an example embodiment, there is no leakage memory cell in the cell string connected to the first bit line BL1, but a leakage memory cell is connected to the fourth word line WL4 in the cell string connected to the second bit line BL2. The memory device 10 may perform a hard off-cell detection operation on memory cells connected to the third word line WL3, and apply an off-cell detection voltage $V_{DET}$ to the memory cells via the third word line WL3. Here, a channel open voltage $V_{OPEN}$ may be applied to the other word lines except for the third word line WL3, and a channel open voltage $V_{OPEN}$ may also be applied to the leakage memory cell. Referring to FIG. 12A, when a channel open voltage $V_{OPEN}$ is applied to the leakage memory cell, at least a portion of a voltage applied to the word line of the leakage memory cell may leak to the second channel CH2, and a voltage of the second channel CH2 may become equal to a voltage of the fourth word line WL4. According to the example embodiment of FIGS. 12A and 12B, a voltage of the second channel CH2 and the voltage of the fourth word line WL4 are described to be equalized due to leakage, but are not limited thereto, and the voltage of the second channel CH2 may have a voltage level between a voltage level of the first channel CH1 and a voltage level of the fourth word line WL4.

Referring to FIGS. 12A and 12B, since no leakage current occurs in cell strings sharing the first channel CH1, a substrate voltage $V_{SUB}$ formed in a read operation may be applied to the first channel CH1. However, as a leakage current occurs in cell strings sharing the second channel CH2, a voltage corresponding to the channel open voltage $V_{OPEN}$ may be applied to the second channel CH2. Here, whether a current channel is formed between a source end and a drain end may be determined based on a potential difference between a voltage applied from a word line of a memory cell and a voltage applied to a channel. A potential difference between a word line and a channel of a target memory cell to be detected, from among the memory cells connected to the first channel CH1, may correspond to a difference between an off-cell detection voltage $V_{DET}$ and a substrate voltage $V_{SUB}$. A difference between the off-cell detection voltage $V_{DET}$ and the substrate voltage $V_{SUB}$ may be higher than a threshold voltage of a normally erased memory cell, and thus, a current channel of the memory cell may be opened.

In contrast, a potential difference between a word line and a channel of a target memory cell among memory cells connected to the second channel CH2 may correspond to a difference between the off-cell detection voltage $V_{DET}$ and the channel open voltage $V_{OPEN}$. According to the example embodiment of FIG. 12B, the channel open voltage $V_{OPEN}$ may be higher than the off-cell detection voltage $V_{DET}$ and thus a potential difference may have a negative value. Accordingly, as a difference between the off-cell detection voltage $V_{DET}$ and the channel open voltage $V_{OPEN}$ is lower than a threshold voltage of a target memory cell, no current channel may be formed. In the example embodiment of FIG. 12B, the off-cell detection voltage $V_{DET}$ is set to be lower than the channel open voltage, but the inventive concept is not limited thereto, and the off-cell detection voltage $V_{DET}$ may be set to be higher than the channel open voltage $V_{OPEN}$ but lower than a threshold voltage of a memory cell from which a difference between the off-cell detection voltage $V_{DET}$ and the channel open voltage $V_{OPEN}$ is erased.

That is, according to the inventive concept, in a method of detecting a hard off-cell, when current leakage has occurred in at least one of memory cells sharing a channel, and when a detection operation is performed on a memory cell where current leakage is not caused, a voltage level of the channel is increased, and accordingly, a threshold voltage for forming a current channel of hard off-cells increases. Thus, when leakage occurs, the memory device 10 may determine at least one of the memory cells shared in a channel, to be a hard off-cell.

Figure 13:
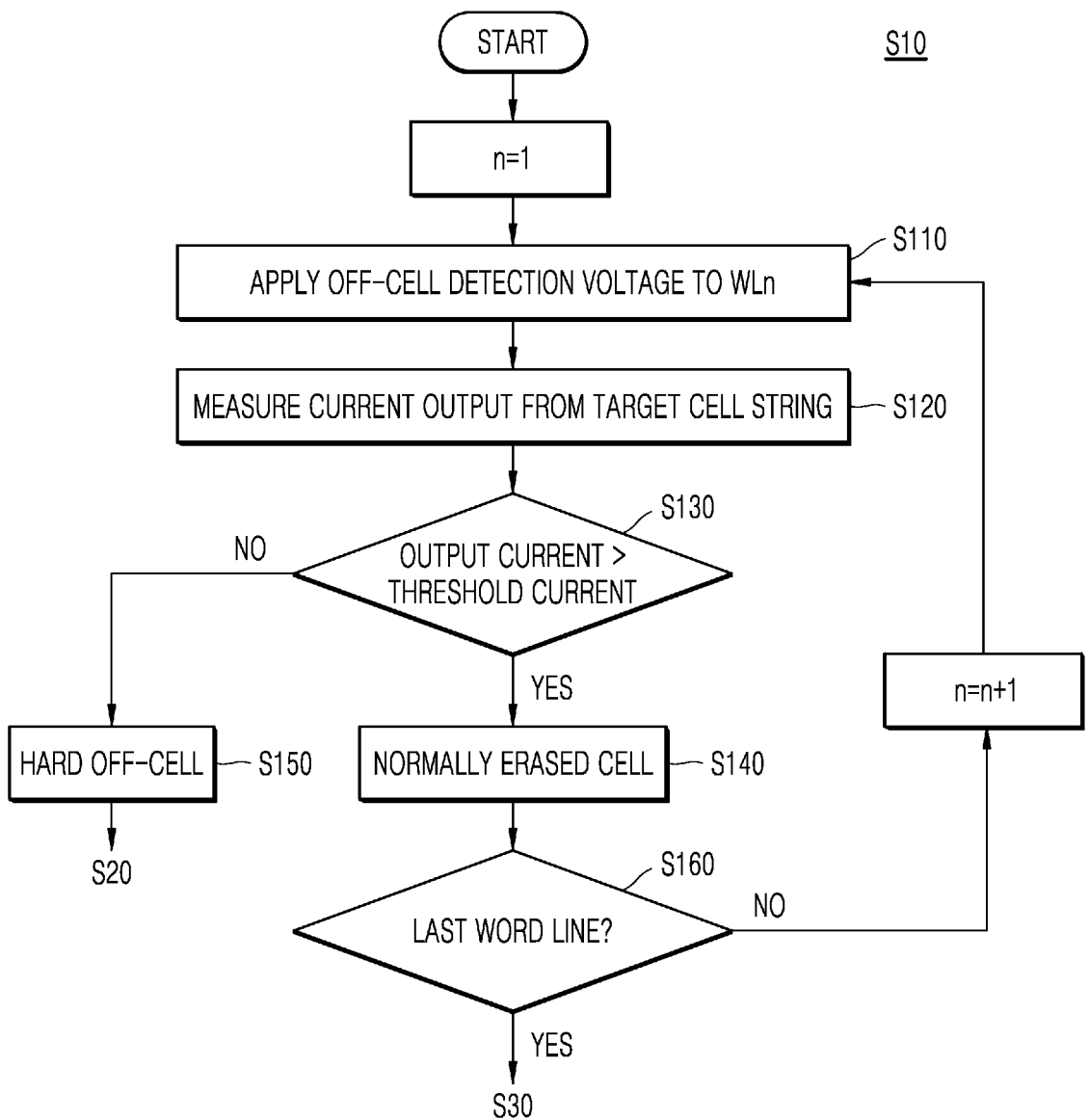
FIG. 13 is a flowchart of a hard off-cell determining method according to an example embodiment.

FIG. 13 is a flowchart of a hard off-cell determining method performed in a target cell string, according to an example embodiment.

The target cell string according to the inventive concept is connected to a plurality of word lines, and by receiving an off-cell detection voltage via the plurality of word lines, the memory device 10 may determine whether a memory cell connected to each word line is a hard off-cell or not. For example, the row decoder 12 may sequentially apply an off-cell detection voltage to word lines connected to a target cell string, and the sensing amp 13 may determine whether a target memory cell is a hard off-cell based on a current level output from the target cell string.

The memory device 10 directed to perform a hard off-cell detection operation may perform a hard off-cell detection operation sequentially from a first word line connected to a target cell string. In operation S110, the memory device 10 may apply an off-cell detection voltage to the target word line. When the memory device 10 has received an off-cell detection command signal, the voltage generator 15 may output an off-cell detection voltage, and the row decoder 12 may apply the off-cell detection voltage to the target word line based on a received row address.

In operation S120, as the off-cell detection voltage is applied to the target memory cell via the target word line, the memory device 10 may measure a current level output from the target cell string. Here, as a channel open voltage is applied to the other word lines except the target word line, channels of memory cells connected to the other word lines are opened and thus a current may flow therethrough, and the target cell string may output different current levels according to whether a channel of a target memory cell to which an off-cell detection voltage is applied is opened. For example, when a threshold voltage of a target memory cell is lower than an off-cell detection voltage, a channel of the target memory cell is opened, and accordingly, a cell string may output a high current level.

In operation S130, the sensing amp 13 may compare a current output from the target cell string with a reference current. According to an example embodiment, the reference current may be a previously designated threshold current. When it is determined that the output current is greater than the threshold current and when it is determined that the output current is equal to or lower than the threshold current, the sensing amp 13 may be a comparator circuit outputting currents or voltages of different levels from each other.

When the sensing amp 13 has determined that the output current is greater than the threshold current, in operation S140, the sensing amp 13 may output a comparison result indicating that the target memory cell is a normally erased cell. On the other hand, when the sensing amp 13 has determined that the output current is equal to or lower than the threshold current, in operation S150, the sensing amp 13 may output a comparison result indicating that the target memory cell is a hard off-cell. For example, as the sensing amp 13 outputs a comparison result of a high voltage level, the memory device 10 may determine the target memory cell to be a normally erased cell. On the other hand, as the sensing amp 13 outputs a comparison result of a low voltage level, the memory device 10 may determine the target memory cell to be a hard off-cell.

When the target memory cell is determined to be a hard off-cell, the memory device 10 or the memory controller 20 may cumulatively count the number of hard off-cells one by one and may repeat the hard off-cell detection operation on a next word line to count the number of hard off-cells of the target cell string.

For instance, in operation S160, it may be determined whether the current word line is the last word line, and based on a determination that the current word line is not the last word line, the memory device 10 or the memory controller 20 may repeat the hard off-cell detection operation on a next word line to count the number of hard off-cells of the target cell string. However, if it is determined that the current word line is the last word line, the memory device 10 or the memory controller 20 may proceed to operation S30 illustrated in FIG. 14.

Figure 14:
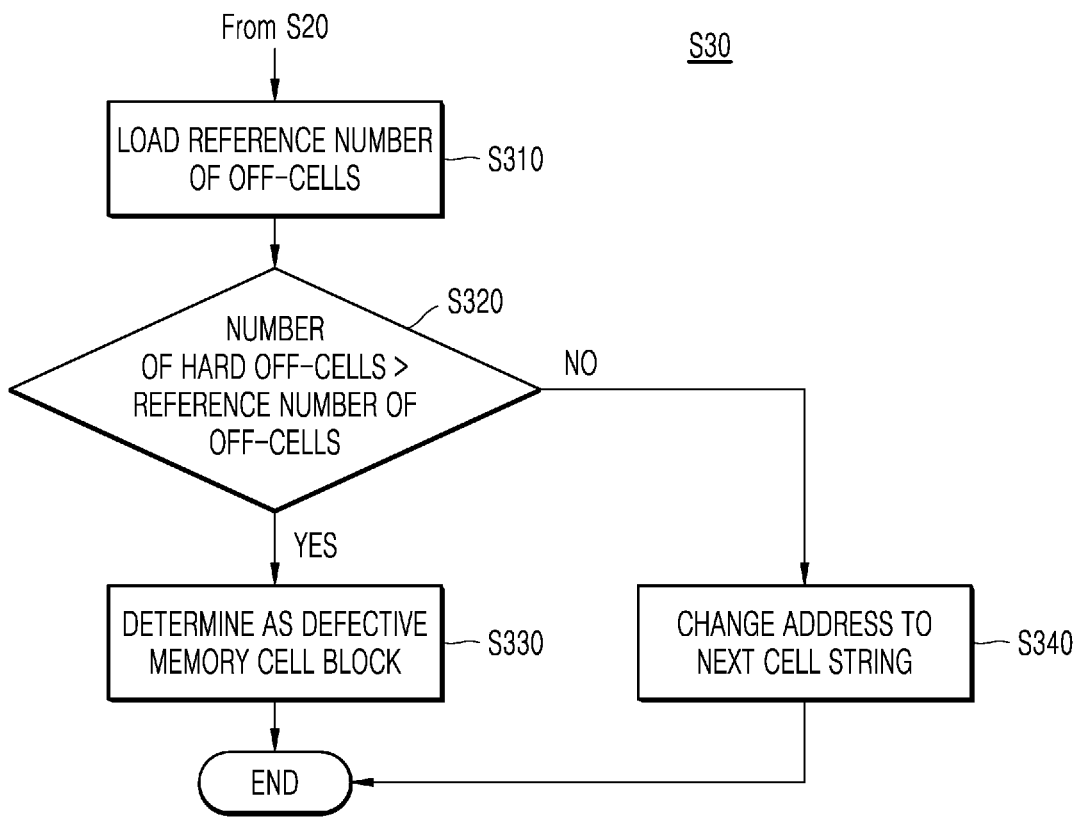
FIG. 14 is a flowchart of a method of determining a defective memory cell block, according to an example embodiment.

FIG. 14 is a flowchart of a method of determining a defective memory cell block, according to an example embodiment.

Referring to FIGS. 9 and 14, the memory controller 20 according to the inventive concept may determine whether a memory cell block including a cell string is a defective memory cell block by comparing a reference number of off-cells stored in accordance with each cell string to the number of hard off-cells counted in operation S20.

In operation S310, the memory controller 20 may load the reference number of off-cells corresponding to the target cell string from an off-cell information storage block of the memory cell array 11. The off-cell information storage block may be a memory cell block storing off-cell information, and the off-cell information may be a data table storing the reference number of off-cells measured from each cell string of memory cell blocks after a process performed by the memory device 10, as illustrated in FIG. 15 and described later. After the process, a hard off-cell may be generated due to a defect of an off-string where a cell string is not connected to a substrate, instead of a defect where a current is leaked from a word line to a channel hole; however, such a defect may be less fatal to writing or reading of data compared to the defect of leakage of a current to a channel hole. Off-cell information may be information storing, as a reference number of off-cells, the number of off-cells of a cell string, generated by defect due to the off-string.

In operation S320, the memory controller 20 may compare the reference number of off-cells corresponding to each cell string with the number of hard off-cells counted in operation S20. When a current leakage has not occurred in a channel hole, even when a hard off-cell is detected from a target cell string, the number of hard off-cells may be equal to or less than the reference number of off-cells.

Accordingly, in operation S330, when the number of hard off-cells of the target cell string is greater than the reference number of off-cells, the memory controller 20 may determine the entire memory cell block including the target cell string to be a defective memory cell block, and in operation S340, when the number of hard off-cells is equal to or less than the reference number of off-cells, the memory controller 20 may determine the target cell string to be a normal cell string and count hard off-cells of a next cell string.

FIG. 15 is a table showing off-cell information stored in an off-cell information storage block, according to an example embodiment.

The memory controller 20 according to an example embodiment may determine whether a target memory cell block including a target cell string is a defective memory cell block based on a reference number of off-cells stored in off-cell information. Referring to FIG. 15, the target cell string may be a set of cell strings that share a string select line, and the memory device 10 may perform a hard off-cell detection operation on the target cell string by applying an open voltage to the string select line.

When an address of a cell string, from which a hard off-cell is to be detected using the memory controller 20 or the memory device 10, is specified by an address of a string select line, hard off-cells of the target cell string are counted, and the memory controller 20 may count a reference number of off-cells corresponding to the address of the string select line from off-cell information. For example, when the memory controller 20 or the memory device 10 operates to detect hard off-cells from a cell string group connected to a third string select line of a second memory block, the memory device 10 may count hard off-cells of the target cell string. Referring to the example embodiment of FIG. 15, as off-cell information, the reference number of off-cells of the cell string group connected to the third string select line of the second memory cell block is two, and accordingly, the memory controller 20 may determine whether the counted hard off-cells are more than two. When the memory controller 20 has determined that the number of counted hard off-cells is greater than two, the second memory cell block may be determined to be a defective memory cell block.

Figure 16:
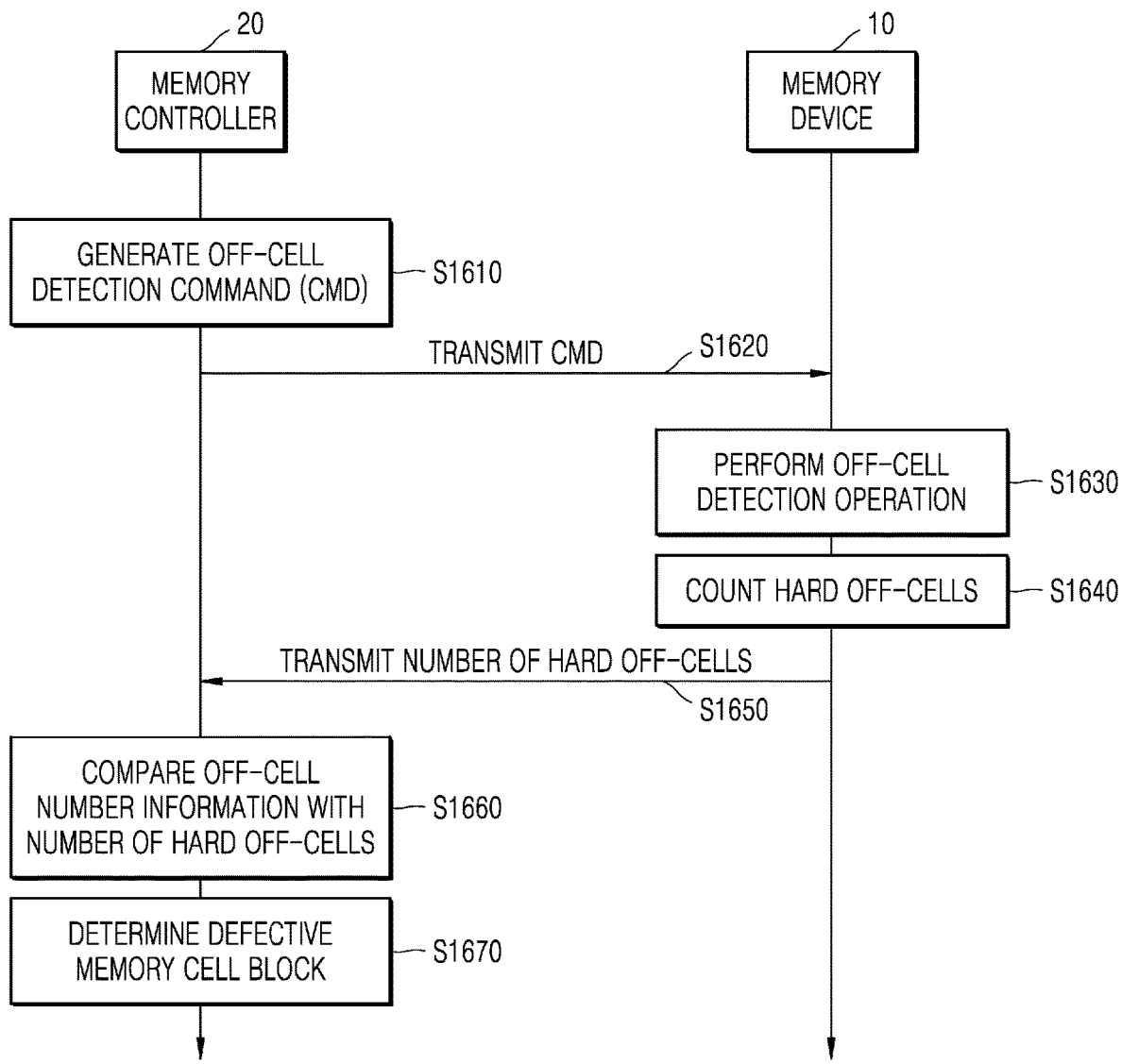
FIG. 16 is a flowchart of an operation sequence of a memory controller and a memory device, according to an example embodiment.

FIG. 16 is a flowchart of an operation sequence of a memory controller 20 and a memory device 10, according to an example embodiment.

In operation S1610, the memory controller 20 may generate an off-cell detection command when receiving a hard off-cell detection instruction from a host device or every designated period. An off-cell detection command may be a signal for directing the memory device 10 to perform a hard off-cell detection operation and may be a code including a series of bits. In operation S1620, after generating an off-cell detection command, the memory controller 20 may transmit the off-cell detection command to the memory device 10.

In operation S1630, the memory device 10 may perform hard off-cell detection by receiving the off-cell detection command. The memory device 10 may apply an off-cell detection voltage to each memory cell of a target cell string, which is at least a portion of a target memory cell block, and determine whether each memory cell is a hard off-cell.

In operation S1640, the page buffer 14 of the memory device 10 may count the number of hard off-cells of the target cell string, and in operation S1650, the memory device 10 may transmit the number of counted hard off-cells of the target cell string to the memory controller 20. The page buffer 14 of the memory device 10 may include a plurality of latches, and in response to receiving information indicating that a memory cell is a hard off-cell, from the sensing amp 13, the page buffer 14 may store the counting number by increasing the counting number one by one.

In operation S1660, the memory controller 20 may load off-cell number information and compare the off-cell number information with the number of hard off-cells, and in operation S1670, the memory controller 20 may determine whether a memory cell block including the target cell string is a defective memory cell block, based on a result of the comparison.

Figure 17:
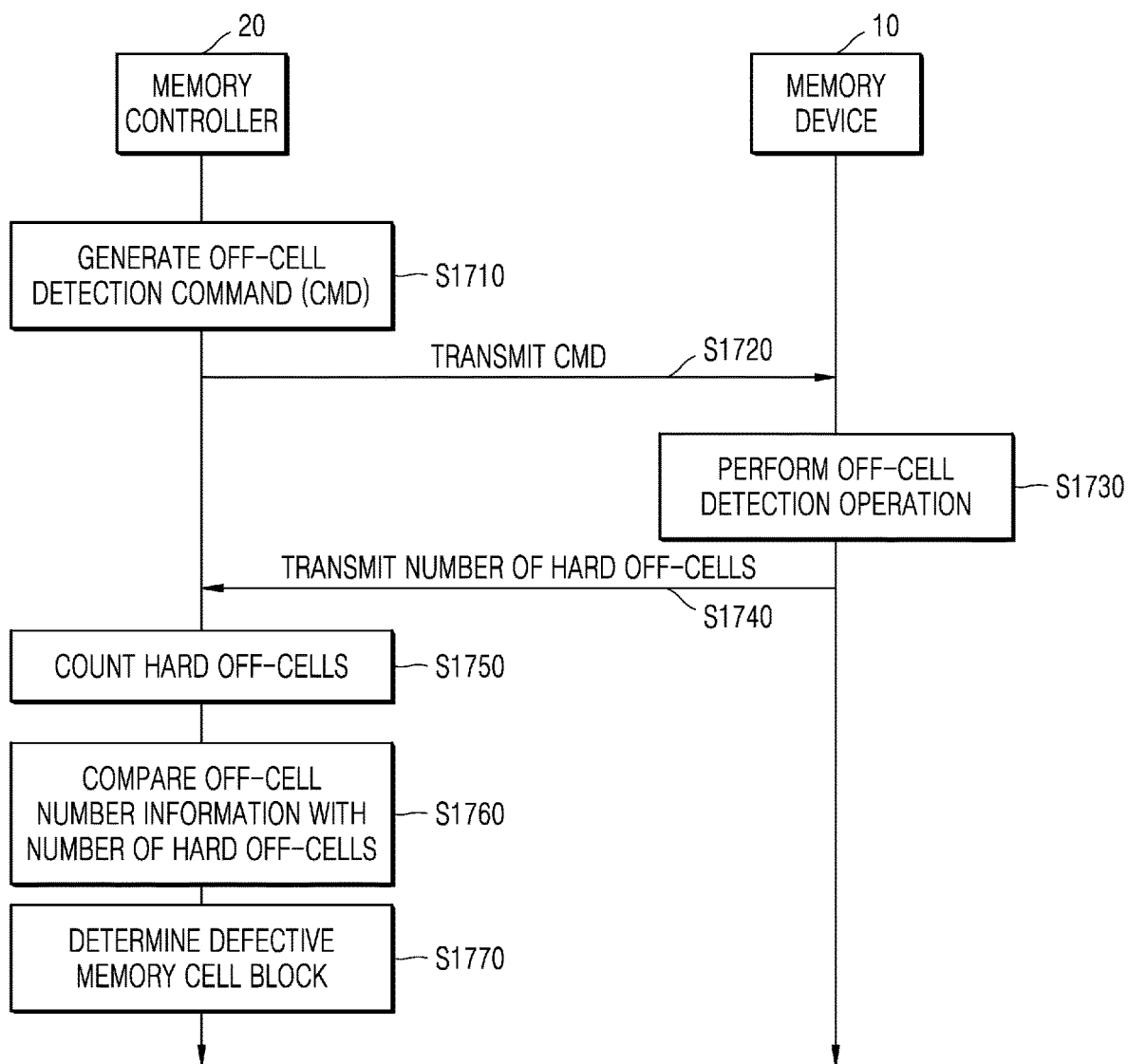
FIG. 17 is a flowchart of an operation sequence of a memory controller and a memory device, according to another example embodiment.

FIG. 17 is a flowchart of an operation sequence of a memory controller 20 and a memory device 10, according to another example embodiment.

While the page buffer 14 of the memory device 10 may count the number of hard off-cells of a target cell string in the example embodiment of FIG. 16, referring to FIG. 17, the memory device 10 according to the inventive concept may transmit hard off-cell information to the memory controller 20 every time when performing a hard off-cell detection operation. Operations S1710 through S1730 are described above with reference to FIG. 16 and thus detailed description thereof will be omitted here.

In operation S1740, the memory device 10 may perform a hard off-cell detection operation on a target cell string, and transmit, as hard off-cell information, information regarding whether a target memory cell is a hard off-cell, to the memory controller 20. In operation S1750, in response to receiving a signal indicating that the target memory cell is a hard off-cell, the off-cell counter 23 of the memory controller 20 may accumulate the number of hard off-cells one by one.

In operation S1760, in response to receiving an end signal indicating that a hard off-cell detection operation is performed on all memory cells of the target cell string, the memory controller 20 may compare the reference number of off-cells with the number of counted hard off-cells.

In operation S1770, the memory controller 20 may determine whether a memory cell block including the target cell string is a defective memory cell block based on a result of comparing the reference number of off-cells with the number of hard off-cells.

Figure 18:
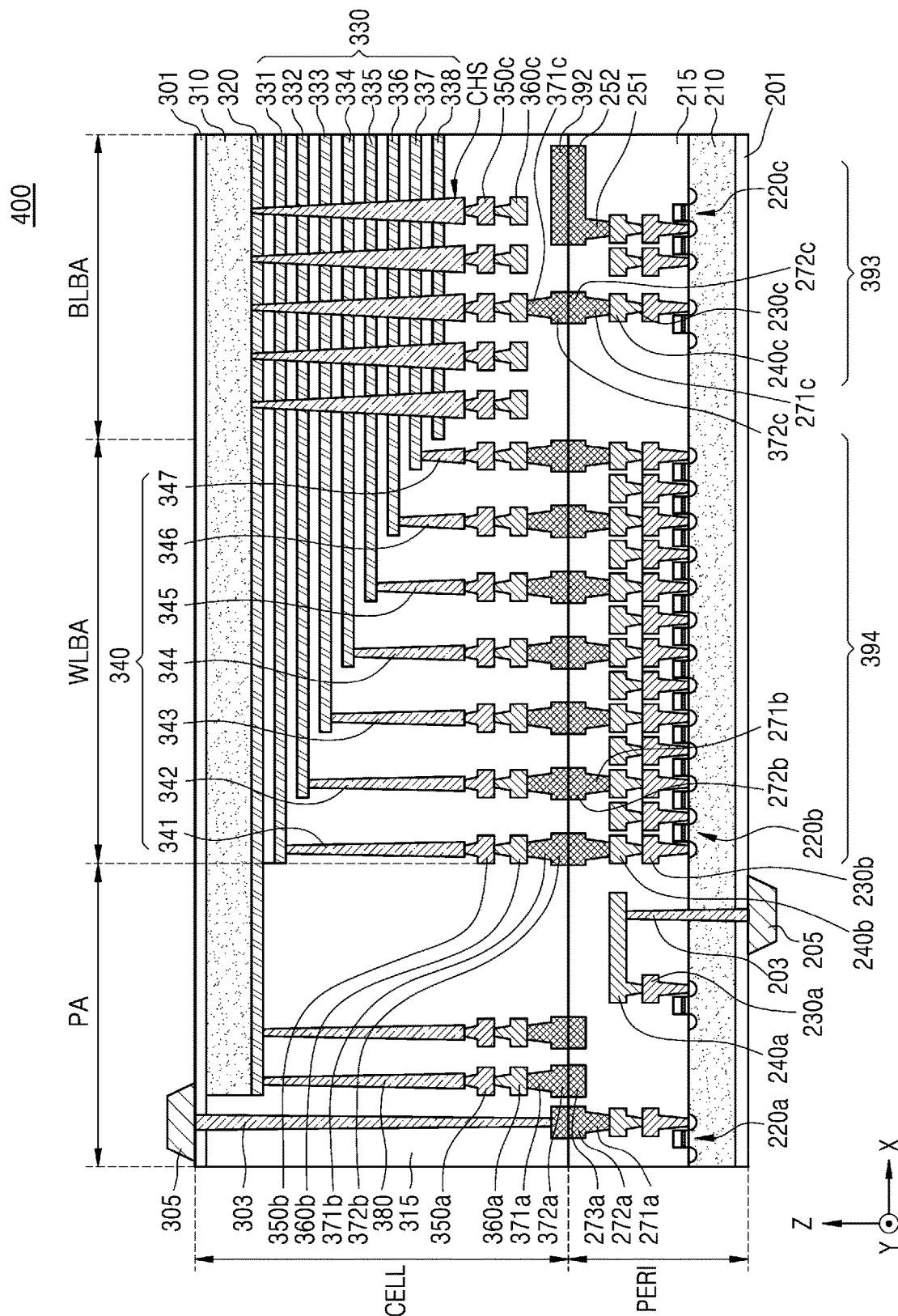
FIG. 18 is a diagram illustrating a memory device having a chip to chip (C2C) structure, according to an example embodiment.

FIG. 18 is a diagram illustrating a memory device having a chip to chip (C2C) structure, according to an example embodiment.

Referring to FIG. 18, a memory device 400 may have a C2C structure. A C2C structure may be formed by manufacturing an upper chip including a cell area CELL on a first wafer, and manufacturing a lower chip including a peripheral circuit area PERI on a second wafer different from the first wafer, and then connecting the upper chip and the lower chip to each other using a bonding method. For example, the bonding method may be a method of electrically connecting a bonding metal formed on an uppermost metal layer of an upper chip to a bonding metal formed on an uppermost metal layer of a lower chip. For example, when the bonding metal includes copper (Cu), the bonding method may be a Cu—Cu bonding method, and the bonding metal may also include aluminum or tungsten.

A peripheral circuit area PERI and a cell area CELL of the memory device 400 may each include an external pad bonding area PA, a word line bonding area WLBA, and a bit line bonding area BLBA.

The peripheral circuit area PERI may include a first substrate 210, an interlayer insulating layer 215, a plurality of circuit elements 220*a*, 220*b*, and 220*c* formed on the first substrate 210, first metal layers 230*a*, 230*b*, and 230*c* respectively connected to the plurality of circuit elements 220*a*, 220*b*, and 220*c*, and second metal layers 240*a*, 240*b*, and 240*c* respectively formed on the first metal layers 230*a*, 230*b*, and 230*c*. In an example embodiment, the first metal layers 230*a*, 230*b*, and 230*c* may include tungsten that has a relatively high resistance, and the second metal layers 240*a*, 240*b*, and 240*c* may include copper that has a relatively low resistance.

According to an example embodiment, only the first metal layers 230*a*, 230*b*, and 230*c* and the second metal layers 240*a*, 240*b*, and 240*c* are illustrated and described, but the inventive concept is not limited thereto, and according to another example embodiment, at least one metal layer may be further formed on the second metal layers 240*a*, 240*b*, and 240*c*. At least a portion of the at least one metal layer formed on the second metal layers 240*a*, 240*b*, and 240*c* may include, for example, aluminum that has a lower resistance than copper, of which the second metal layers 240*a*, 240*b*, and 240*c* are formed.

The interlayer insulating layer 215 may be disposed on the first substrate 210 to cover the plurality of circuit elements 220*a*, 220*b*, and 220*c*, the first metal layers 230*a*, 230*b*, and 230*c*, and the second metal layers 240*a*, 240*b*, and 240*c*, and may include an insulating material such as silicon oxide or silicon nitride.

Lower bonding metals 271*b* and 272*b* may be formed on the second metal layer 240*b* in the word line bonding area WLBA. In the word line bonding area WLBA, the lower bonding metals 271*b* and 272*b* of the peripheral circuit area PERI may be electrically connected to upper bonding metals 371*b* and 372*b* of the cell area CELL by using a bonding method, and the lower bonding metals 271*b* and 272*b* and the upper bonding metals 371*b* and 372*b* may include, for example, aluminum, copper, or tungsten.

The cell area CELL may provide at least one memory block. The cell area CELL may include a second substrate 310 and a common source line 320. A plurality of word lines 331 through 338 (collectively 330) may be stacked on the second substrate 310 in a direction perpendicular to an upper surface of the second substrate 310 (Z-axis direction). String select lines and a ground select line may be arranged on and under each of the word lines 330, and the plurality of word lines 330 may be arranged between the string select lines and the ground select line.

In the bit line bonding area BLBA, a channel structure CH may extend in a direction perpendicular to the upper surface of the second substrate 310 and pass through the word lines 330, the string select lines, and the ground select line. The channel structure CH may include, for example, a data storage layer, a channel layer, and a buried insulating layer, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction parallel to the upper surface of the second substrate 310 (Y-axis direction).

In the example embodiment illustrated in FIG. 18, an area where the channel structure CH and the bit line 360c or the like are arranged may be defined as the bit line bonding area BLBA. The bit line 360c may be electrically connected to the circuit elements 220c providing a page buffer 393 in the peripheral circuit area PERI in the bit line bonding area BLBA. For example, the bit line 360c may be connected to the upper bonding metals 371c and 372c in the peripheral circuit area PERI, and the upper bonding metals 371c and 372c may be connected to the lower bonding metals 271c and 272c that are connected to the circuit elements 220c of the page buffer 393.

In the word line bonding area WLBA, the word lines 330 may extend in a second direction parallel to the upper surface of the second substrate 310 (X-axis direction) and may be connected to a plurality of cell contact plugs 341 through 347 (collectively 340). The word lines 330 and the cell contact plugs 340 may be connected to each other via pads provided by at least some of the word lines 330 extending by different lengths in the second direction. A first metal layer 350b and a second metal layer 360b may be sequentially connected on the cell contact plugs 340 connected to the word lines 330. The cell contact plugs 340 may be connected to the peripheral circuit area PERI in the word line bonding area WLBA via the upper bonding metals 371b and 372b of the cell area CELL and the lower bonding metals 271b and 272b of the peripheral circuit area PERI.

The cell contact plugs 340 may be electrically connected to the circuit elements 220b that provide a row decoder 394 in the peripheral circuit area PERI. In an example embodiment, an operating voltage of the circuit elements 220b providing the row decoder 394 may be different from an operating voltage of the circuit elements 220c providing the page buffer 393. For example, the operating voltage of the circuit elements 220c providing the page buffer 393 may be higher than the operating voltage of the circuit elements 220b that provide the row decoder 394.

A common source line contact plug 380 may be arranged in the external pad bonding area PA. The common source line contact plug 380 may include a conductive material such as a metal, a metal compound, or polysilicon, and may be electrically connected to the common source line 320. A first metal layer 350a and a second metal layer 360a may be sequentially stacked on the common source line contact plug 380. For example, an area where the common source line contact plug 380, the first metal layer 350a, and the second metal layer 360a are arranged may be defined as the external pad bonding area PA.

In the external pad bonding area PA, first and second input/output pads 205 and 305 may be arranged. Referring to FIG. 18, a lower insulating layer 201 covering a lower surface of the first substrate 210 may be formed under the first substrate 210, and a first input/output pad 205 may be formed on the lower insulating layer 201. The first input/output pad 205 is connected to at least one of the plurality of circuit elements 220a, 220b, and 220c arranged in the peripheral circuit area PERI, via a first input/output contact plug 203, and may be separated from the first substrate 210 via the lower insulating layer 201. Also, a lateral insulating layer may be arranged between the first input/output contact plug 203 and the first substrate 210 to electrically isolate the first input/output contact plug 203 from the first substrate 210.

Referring to FIG. 18, an upper insulating layer 301 covering the upper surface of the second substrate 310 may be formed on the second substrate 310, and a second input/output pad 305 may be arranged on the upper insulating layer 301. The second input/output pad 305 may be connected to at least one of the plurality of circuit elements 220a, 220b, and 220c arranged in the peripheral circuit area PERI, via a second input/output contact plug 303.

According to example embodiments, in an area in which the second input/output contact plug 303 is disposed, the second substrate 310 and the common source line 320 or the like may not be arranged. In addition, the second input/output pad 305 may not overlap the word lines 330 in a third direction (Z-axis direction). Referring to FIG. 18, the second input/output contact plug 303 is separated from the second substrate 310 in a direction parallel to the upper surface of the second substrate 310, and may pass through an interlayer insulating layer 315 of the cell area CELL to be connected to the second input/output pad 305.

According to example embodiments, the first input/output pad 205 and the second input/output pad 305 may be formed selectively. For example, the memory device 400 may include only the first input/output pad 205 arranged on the first substrate 210 or only the second input/output pad 305 arranged on the second substrate 310. Alternatively, the memory device 400 may include both the first input/output pad 205 and the second input/output pad 305.

In each of the external pad bonding area PA and the bit line bonding area BLBA that are included in each of the cell area CELL and the peripheral circuit area PERI, a metal pattern of an uppermost metal layer of each of the cell area CELL and the peripheral circuit area PERI may be a dummy pattern or the uppermost metal layer may be hollow.

In the external pad bonding area PA of the memory device 400, a lower metal pattern 273a having a same pattern as an upper metal pattern 372a of the cell area CELL may be formed in the uppermost metal layer of the peripheral circuit area PERI to correspond to the upper metal pattern 372a formed in the uppermost metal layer of the cell area CELL. The lower metal pattern 273a formed in the uppermost metal layer of the peripheral circuit area PERI may not be connected to an additional contact in the peripheral circuit area PERI. Similarly, an upper metal pattern having a same pattern as a lower metal pattern of the peripheral circuit area PERI may be formed on an upper metal layer of the cell area CELL to correspond to the lower metal pattern formed in the uppermost metal layer of the peripheral circuit area PERI in the external pad bonding area PA.

The lower bonding metals 271b and 272b may be formed on the second metal layer 240b in the word line bonding area WLBA. In the word line bonding area WLBA, the lower bonding metals 271b and 272b of the peripheral circuit area PERI may be electrically connected to the upper bonding metals 371b and 372b of the cell area CELL by using a bonding method.

Also, an upper metal pattern 392 having a same pattern as a lower metal pattern 252 of the peripheral circuit area PERI may be formed in the uppermost metal layer of the cell area CELL to correspond to the lower metal pattern 252 formed in the uppermost metal layer of the peripheral circuit area PERI in the bit line bonding area BLBA. No contact may be formed on the upper metal pattern 392 formed in the uppermost metal layer of the cell area CELL.

While the inventive concept has been particularly shown and described with reference to example embodiments thereof, it will be understood that various changes in form and details may be made therein without departing from the spirit and scope of the following claims.

What is claimed is:

1. A method of detecting a defective memory cell block in a nonvolatile memory system, the method comprising:
    performing, after an erase operation, a read operation on one or more memory cells included in a target memory cell block based on an off-cell detection voltage that is different from a read reference voltage;
    counting a number of hard off-cells having a higher threshold voltage than the off-cell detection voltage among the one or more memory cells based on a result of performing the read operation; and
    identifying whether the target memory cell block is a defective memory cell block based on the number of hard off-cells.

2. The method of claim 1, wherein the performing of the read operation comprises setting, as the off-cell detection voltage, a value between a threshold voltage level of an erased memory cell and a threshold voltage level of a hard off-cell.

3. The method of claim 1, wherein the performing of the read operation comprises:
    applying the off-cell detection voltage to each of a plurality of word lines connected to the target memory cell block; and
    measuring an output current from a cell string connected to the target memory cell block.

4. The method of claim 3, wherein the counting the number of hard off-cells comprises identifying whether a target memory cell in the cell string is a hard off-cell based on the output current.

5. The method of claim 4, wherein the counting the number of hard off-cells comprises identifying the target memory cell as the hard off-cell based on the output current being less than a threshold current.

6. The method of claim 1, wherein the identifying whether the target memory cell block is the defective memory cell block comprises:
    comparing the number of hard off-cells with a reference number of off-cells; and
    identifying whether the target memory cell block is the defective memory cell block based on a result of the comparing.

7. The method of claim 6, wherein the reference number of off-cells comprises an initial number of off-cells corresponding to string select lines of the target memory cell block.

8. The method of claim 6, wherein the identifying whether the target memory cell block is the defective memory cell block comprises identifying the memory cell block as the defective memory cell block based on the number of hard off-cells exceeding the reference number of off-cells.

9. A nonvolatile memory system comprising:
    a memory device including a plurality of memory cell blocks; and
    a memory controller comprising: a command generator configured to output an off-cell detection command signal to direct the memory device to perform a hard off-cell detection operation after the memory device performs an erase operation; and a defective memory cell block identifier configured to output a signal indicating whether a target memory cell block is a defective memory cell block based on a number of hard off-cells among one or more memory cells included in the target memory cell block according to the off-cell detection command signal,
    wherein the memory device is configured to perform, based on the off-cell detection command signal, a read operation on the one or more memory cells based on an off-cell detection voltage that is different from a read reference voltage.

10. The nonvolatile memory system of claim 9, wherein the memory device comprises a voltage generator configured to output, as the off-cell detection voltage, a value between a threshold voltage level of an erased memory cell and a threshold voltage level of a hard off-cell, based on the off-cell detection command signal.

11. The nonvolatile memory system of claim 9, wherein the memory device comprises:
    a memory cell array in which a plurality of word lines are connected to memory cells of a target cell string such that a voltage is applied to the memory cells;
    a row decoder configured to apply the off-cell detection voltage to a target memory cell among the memory cells via a target word line from among the plurality of word lines; and
    a sensing amplifier configured to receive an output current from the target memory cell based on the off-cell detection voltage.

12. The nonvolatile memory system of claim 11, wherein the sensing amplifier outputs a signal indicating whether the target memory cell is a hard off-cell, based on the output current.

13. The nonvolatile memory system of claim 12, wherein the sensing amplifier outputs a signal indicating that the target memory cell is the hard off-cell based on the output current being less than a threshold current.

14. The nonvolatile memory system of claim 9, wherein the memory device comprises a pager buffer configured to count the number of hard off-cells from among the one or more memory cells based on a result of the performing of the read operation.

15. The nonvolatile memory system of claim 9, wherein the memory controller comprises an off-cell counter configured to receive a result of the performing of the read operation and count the number of hard off-cells of the one or more memory cells based on a result of the performing of the read operation.

16. The nonvolatile memory system of claim 9, wherein the memory device comprises an off-cell information storage block configured to store a block address, a string select line (SSL) address, and information of a reference number of off-cells corresponding to the block address and the SSL address, wherein the defective memory cell block identifier configured to identify whether the memory cell block is the defective memory cell block by comparing the reference number of off-cells with the number of hard off-cells.

17. The nonvolatile memory system of claim 16, wherein, in the off-cell information storage block, an initial number of off-cells corresponding to each string select line of the plurality of memory cell blocks is stored to correspond to the block address and the SSL address.

18. The nonvolatile memory system of claim 16, wherein the defective memory cell block identifier is further configured to identify the target memory cell block as the defective memory cell block based on the number of hard off-cells exceeding the reference number of off-cells.

19. A nonvolatile memory controller comprising:
a memory storing one or more instructions; and
a processor configured to execute the one or more instructions to implement:

a command generator configured to output an off-cell detection command signal to direct a memory device to perform a hard off-cell detection operation after the memory device performs an erase operation; and a defective memory cell block identifier configured to output a signal indicating whether a memory cell block including a target cell string is a defective memory cell block based on a number of hard off-cells among one or more memory cells included in a target memory cell block according to the off-cell detection command signal.

20. The nonvolatile memory controller of claim 19, wherein the command generator is further configured to output a command signal directing to set, as an off-cell detection voltage, a value between a threshold voltage level of an erased memory cell and a threshold voltage level of a hard off-cell.

* * * * *